United States Patent [19]

Forney, Jr.

[11] Patent Number: 4,933,956
[45] Date of Patent: Jun. 12, 1990

[54] SIMPLIFIED DECODING OF LATTICES AND CODES

[75] Inventor: George D. Forney, Jr., Cambridge, Mass.

[73] Assignee: Codex Corporation, Mansfield, Mass.

[21] Appl. No.: 828,397

[22] Filed: Feb. 11, 1986

Related U.S. Application Data

[63] Continuation-in-part of Ser. No. 485,069, Apr. 14, 1983, Pat. No. 4,597,090.

[51] Int. Cl.$^5$ .............................................. H04L 1/00
[52] U.S. Cl. ....................................... 375/94; 371/43; 371/47.1; 375/58
[58] Field of Search ....................... 375/25, 37, 39, 58, 375/75, 94; 371/30, 37, 43, 49, 37.4, 37.7, 49.1

[56] References Cited

PUBLICATIONS

C. M. Hackett; "An Efficient Algorithm for Soft-Decision Decoding of the Extended Golay Code", IEEE Trans on Communications, vol. Com-29, No. 6, Jun. 1981 pp. 909-911.

C. M. Hackett, Jr., "Correction to an Efficient Algorithm for Soft-Decision". . . IEEE Transactions on Communications, vol. Com-30, No. 3, Mar. 1982, p. 554.

Conway and Sloan, "A Fast Encoding Method for Lattice Codes and Quantizers", IEEE Transactions on Information Theory, vol. IT-29, No. 6, Nov. 1983, pp. 820-824.

Tendolkav and Hartman, "Generalization of Chase Algorithms for Soft Decision Coding of Binary Linear Codes", IEEE Transactions on Information Theory, vol. IT-30, No. 5, Sep. 1984, pp. 714-721.

Sayegh, "A Class of Optimum Block Codes in Signal Space", IEEE Transactions on Communications, vol. COM34, No. 16, Oct., 1986, pp. 1043-1045.

Ginzburg, "Multidimensional Signals for a Continuous Channel", Plenum Publishing Corp. 1984, pp. 20-34.

Imai, "A New Multilevel Coding Method Using Error-Correcting Codes", IEEE Transactions on Information Theory, vol. IT23, No. 3, 1977, pp. 371-377.

Letter to G. D. Forney from Soheil Sayegh, Jan. 5, 1987.

Letter to G. D. Forney from Soheil Sayegh, Oct. 9, 1986.

Leech, J. and Sloane, J. A., "Sphere Packings and Error-Correcting Codes", Can. J. Math., vol. XXIII, No. 4, 1971 pp. 718-745.

(List continued on next page.)

Primary Examiner—Benedict V. Safourek
Attorney, Agent, or Firm—Fish & Richardson

[57] ABSTRACT

A decoder including first and second decoding stages for selecting a codeword near to a given N-tuple r which is a sequence of N real values $r_i$ representing signals. The first stage includes substages associated respectively with sections $r_j$ of N-tuple r, each substage for evaluating distances between multiple sets of possible partial codewords and the section $r_j$ and for selecting a survivor from each of the multiple sets based on the distances. The second stage includes n−1 substages, each of which operates with respect to a supersection made up of a combination of two parts, each part being a section or a supersection combined in an earlier substage of the second stage and it includes a final substage which operates with respect to a final supersection whose parts make up the complete N-tuple r. Each of the n−1 substages is for evaluating distances between multiple sets of possible partial codewords and the received values in the corresponding supersection based on the survivor distances for the survivors corresponding to each of the two parts and for selecting a survivor from each of the multiple sets based on the distances. The final substage is for evaluating distances between the codewords and the N-tuple r based on the survivor distances for the survivors corresponding to each of two parts, for selecting a finally decoded codeword based on the distances between the codewords and N-tuple r, and for providing information about the finally decoded codeword as decoder output.

83 Claims, 16 Drawing Sheets

OTHER PUBLICATIONS

Wolf, "Efficient Maximum Likelihood Decoding of Linear Block Codes", IEEE Trans. on Information Theory, vol. IT-24, No. 1, Jan. 1978, pp. 76-80.

Conway et al., "Fast Quantizing and Decoding Algorithms for Lattice Quantizers and Codes", IEEE Trans. on Information Theory, vol. IT-28, No. 2, Mar., 1982, pp. 227-232.

Conway et al., "Soft Decoding Techniques for Codes and Lattices, Including the Golay Code and the Leech Lattice", IEEE Trans. on Information Theory, vol. IT-32, No. 1, Jan., 1986, pp. 41-50.

MacWilliams and Sloane, "The Theory of Error Correcting Codes", Chapter 18, pp. 581-586.

Forney et al., "Efficient Modulation for Band-Limited Channels", IEEE Journal on Selected Areas in Communications, vol. SAC-2, No. 5, Sep., 1984, pp. 632-647.

Solomon et al., "A Connection Between Block and Convolutional Codes", SIAM J. Appl. Math., vol. 37, No. 2, Oct., 1979, pp. 358-369.

TRELLIS 1

TRELLIS 2

TRELLIS $1_L$

TRELLIS $2_L$

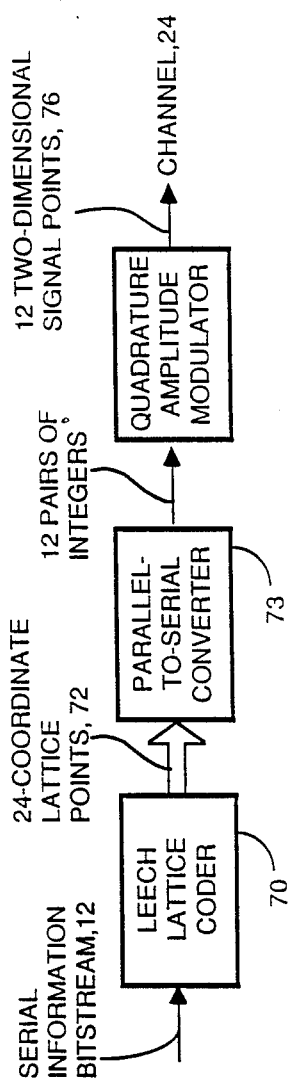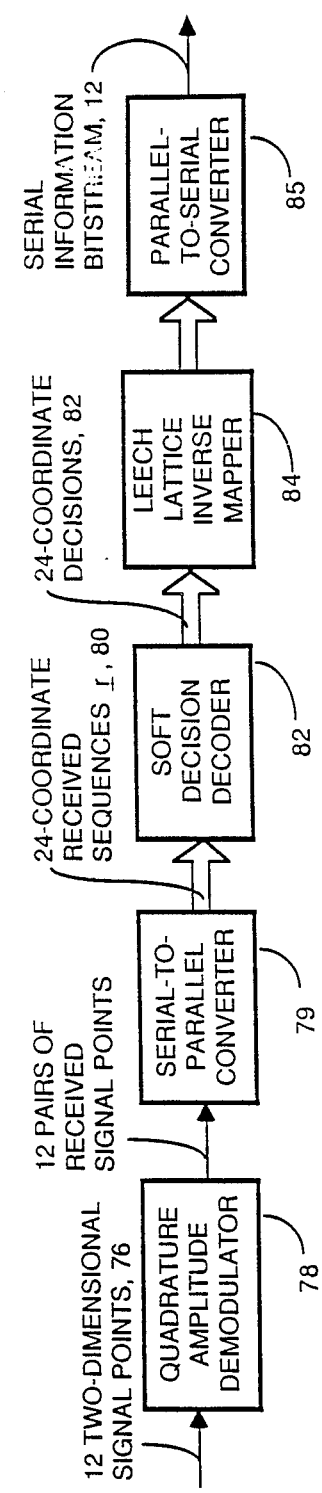

TRELLIS 3

TRELLIS 4

TRELLIS 5

SIMPLIFIED DECODING OF LATTICES AND CODES

BACKGROUND OF THE INVENTION

This application is a continuation-in-part of Forney, U.S. patent application Ser. No. 485,069, filed Apr. 14, 1983, U.S. Pat. No. 4,597,090, assigned to the same assignee as this application, and fully incorporated herein by reference.

This invention relates to communication over band-limited channels of the kind in which codes or lattices are used to represent information to be communicated.

A code is a finite set of codewords each made up of a finite sequence of N symbols which are themselves elements of a finite field. For example, in binary codes each symbol in each codeword is one of two elements (typically 0 or 1). A lattice is a set of points (or codewords, or N-tuples), each comprising a finite sequence of N symbols that are drawn from an infinite set (typically, the set of integers).

In communication systems, a so-called coding gain can be attained by mapping groups of information bits to be communicated into codeword points drawn from sets which have certain distance properties. The receiver takes advantage of the distance properties to achieve the coding gain.

Codes and lattices which are relatively long (i.e., in which each codeword or point has a large number of N symbols) offer the prospect for relatively large coding gains (over conventional uncoded modulation systems) but they present extremely complex decoding problems. Examples of such potentially useful codes and lattices are the well-known (24, 12, 8) Golay code and the well-known 24-dimensional Leech lattice.

A so-called (N, K) binary block code has a generator matrix consisting of K N-tuples (rows), whose $2^K$ binary linear combinations are the $2^K$ codewords in the code. The so-called dual code of such a code is defined as the set of all N-tuples which are orthogonal to all $2^K$ codewords, i.e., whose inner product with any codeword in the original code is zero (modulo 2). It has long been known that the dual code is an (N, N−K) code with $2^{N-K}$ codewords which are the binary linear combinations of the N−K rows of the parity-check matrix of the original code. That is, the parity-check matrix is a generator matrix for the dual code.

Wolf, Efficient Maximum Likelihood Decoding of Linear Block Codes Using a Trellis, IEEE Trans. on Inf. Theory, Vol. IT-24, No. January, 1978, discloses a general method for representing block codes by trellis diagrams. Wolf points out that the number of states at any position along the trellis is no more than $q^K$, where q is the number of possible symbols from which each coordinate of each codeword is drawn, and K is the number of symbols in a codeword. In fact, Wolf shows that the number of such trellis states need be no more than $q^{N-K}$ where K is the number of information symbols in each codeword, N−K is the number of parity symbols in each codeword, and $q^{N-K}$ is the number of words in the dual code. Application of his method would be expected to yield, for example, a $2^{12}$-state trellis for the Golay code.

In Fast Quantizing and Decoding Algorithms for Lattice Quantizers and Codes, IEEE Trans. on Inf. Theory, Vol. IT-28, No. 2, March, 1982, Conway and Sloane gave maximum likelihood decoding methods for simple lattices (N≦8) More recently, Conway & Sloane, "Decoding Techniques for Codes and Lattices, Including the Golay Code and the Leech Lattice", IEEE Trans. on Inf. Theory, Vol. IT-32, No. 1, January, 1986, give maximum likelihood decoding procedures for more complicated codes and lattices, including the Golay code and the Leech lattice.

SUMMARY OF THE INVENTION

One general feature of the invention is a decoder for selecting a codeword near to a given N-tuple r, the codeword representing a point in an N-dimensional lattice, the N-tuple r comprising a sequence of N real values $R_i$ representing signals, the values $r_i$ of the N-tuple r being organized into n sections $r_j$ respectively of lengths $N_j$, $1 \leq j \leq n$, where $n \geq 3$, and $N_j < N$; the decoder includes at least first and second decoding stages; in the first decoding stage there are substages associated respectively with the sections $r_j$, $1 \leq j \leq n$; each substage of the first stage includes means for evaluating distances between multiple sets of possible partial codewords and the section $r_j$, the partial codewords comprising the corresponding $N_j$ symbols appearing in a subset of the codewords, means for selecting as a survivor from each of the multiple sets one partial codeword based on the distances, and for providing to the second decoding stage information indicative of each of the multiple survivors and its distance; the second decoding stage includes n−1 substages, each substage in the second stage corresponding to a supersection comprising at least two of the sections; each substage of the second stage corresponds to a supersection made up of a combination of two parts, each part being a section or a supersection combined in an earlier substage of the second stage, a final said substage corresponding to a final supersection whose parts make up the complete N-tuple r; each substage of the second stage except the final substage includes means for evaluating distances between multiple sets of possible partial codewords and received values in the corresponding supersection, the evaluation being based on information indicative of the survivor distances for the survivors corresponding to each of the two parts, means for selecting as a survivor from each of the multiple sets one partial codeword on the basis of the distances and for providing information indicative of each of the multiple survivors and its distance to subsequent decoding substages of the second stage; the final substage includes means for evaluating distances between the codewords and the N-tuple r, the evaluation being based on the indications of the survivor distances for the survivors corresponding to each of two parts, means for selecting one codeword as a finally decoded codeword based on the distances between the codewords and the N-tuple r, and for providing information indicative of the finally decoded codeword as an output of the decoder.

In some embodiments, $N_j > 2$ for all j, $1 \leq j \leq n$.

Another general feature is such a decoder for use with codewords drawn from among the codewords of a code.

Another general feature is a decoder for selecting multiple survivors from multiple sets of partial codewords near to a given $N_j$-tuple $r_j$, each partial codeword comprising $N_j$ symbols appearing in a subset of codewords, each codeword representing a point in an N-dimensional lattice, the $N_j$-tuple $r_j$ comprising a sequence of $N_j < N$ real values representing signals, the values $r_i$ of $N_j$-tuple $r_j$ being organized into $n_j$ sections $r_K$ respectively of lengths $N_K$, $1 \leq k \leq n_j$ where $n_j \geq 2$, $N_K < N_j$; the decoder includes at least first and second decoding stages; the first decoding stage includes a substage for each $r_K$, $1 \leq k \leq n_j$; each substage of the first decoding stage includes means for evaluating distances between multiple sets of possible partial codewords and the section $r_K$, the partial codewords comprising the corresponding $N_K$ symbols appearing in a subset of codewords, means for selecting as a survivor from each of the multiple sets one partial codeword based on the distances, and for providing information indicative of each of the multiple survivors and its distance to the second decoding stage; the second decoding stage includes n-1 substages, each substage in the second stage corresponding to a supersection comprising at least two of the sections, each substage of the second stage corresponding to a supersection made up of a combination of two parts, each part being a section or a supersection combined in an earlier substage of the second stage, a final substage corresponding to a final supersection corresponding to the complete $N_j$-tuple $r_j$; each substage includes means for evaluating distances between multiple sets of possible partial codewords and received values in the corresponding supersection, the evaluation being based on information indicative of the survivor distances for the survivors corresponding to each of the two parts, means for selecting as a survivor from each of the multiple sets one partial codeword on the basis of the distances, and for providing information indicative of each of the multiple survivors and its distance to subsequent decoding substages of the second stage, or if the substage is the final substage, as a final output of the decoder.

Another general feature is such a decoder for use with codewords drawn from among the codewords of a code and in which $N_J > 2$ for all $j$, $1 \leq j \leq n$.

Such trellis-type decoding of lattices and codes is less complex than known decoding schemes.

Preferred embodiments of the invention include the following features. The lattice comprises all points congruent (modulo P) to a finite set of lattice points of size S, a dual lattice to the lattice comprises all points congruent (modulo P) to a finite set of dual lattice points of size T, and the number of survivors from the multiple sets for every stage is less than a number M equal to the lesser of S and T. The number of survivors is less than M in each said substage of the second stage. The value n is 3 and there are two decoding stages. The value n is 4 and the second decoding stage comprises three substages including the final substage. $N_1 = N_2 = N_3 = 8$. N is 24. The code is a binary (24, 12, 8) Golay code. $S = 2^{12}$, $T = 2^{12}$, and the number of survivors is $2^6$. Normalized versions of the distances are generated such that the relative distance rankings of the partial codewords are not affected, the normalized versions being generated without multiplications. The second decoding stage selects the finally decoded codeword based on a Viterbi algorithm. In the normalized versions the distance between the ith symbol $r_i$ of said N-tuple r can be obtained directly from $r_i$, and the distance of each partial codeword and its complement are the same except for their signs. Each partial codeword is an $N_P$-tuple, where $N_P = 2^S$, s an integer, and the parts making up the $N_P$-tuple comprise $N_P/2$-tuples. The second decoding stage iteratively evaluates 1-tuples, 2-tuples, ... , $N_P$-tuples. The decoder can be adapted for use in a communication system of the kind in which information to be sent over a band-limited channel is encoded into a succession of codewords, and wherein the decoder comprises means for deciding which codeword was sent on the basis of a received set of values corresponding to the N-tuple r. In the case of lattice decoding, the lattice is equivalent to a 24-dimensional Leech-type lattice whose points have integer coordinates, and the maximum number of survivors in any substage is $2^8$. In some embodiments, the codewords are each a linear combination of rows of a matrix that can be expressed in the form:

$$G = \begin{bmatrix} A & O & O \\ O & A' & O \\ O & O & A'' \\ B & B' & O \\ O & B'' & B''' \\ C & C' & C'' \end{bmatrix}$$

$A = A' = A''$, $B = B' = B'' = B'''$, and $C = C' = C''$.

In other embodiments, the codewords are each a linear combination of rows of a matrix that can be expressed in the form $$G = \begin{bmatrix} A & O & O & O \\ O & A & O & O \\ O & O & A & O \\ O & O & O & A \\ B & B & O & O \\ O & B & B & O \\ O & O & B & B \\ C & C & C & C \end{bmatrix}$$

A generates a dense lattice, B and A together generate a dense lattice with smaller distance, and C, B, and A together generate a dense lattice with still smaller distance. Each column of matrix G corresponds to one section of the trellis. Each N-tuple r is transformed into a form that is generated by a predetermined form of matrix, e.g., by an inverse permutation, or by rotations in two-dimensional space. The selected codeword is the *nearest* codeword to the N-tuple r. In the case of lattice decoding, the lattice is equivalent to an integer lattice based on binary codes, and the decoder applies, as a first stage in decoding the N-tuple r, binary decoding procedures applicable to those binary codes. The binary codes may include a Golay code, with the points of the lattice being congruent (modulo P) to multiples of codewords in the Golay code. The Golay decoding is applied twice, once to a lattice derived from the Leech lattice, and the second time to a coset of the derived lattice. The lattice has points such that a predetermined set of coordinate coefficients for the symbols of the points has odd or even parity, the N-tuple r is decoded without regard to the parity into a near possible codeword, and one possible near codeword is modified by changing a single symbol to satisfy the parity. The single symbol is selected as the one that is most distant from the corresponding coordinate of the N-tuple r.

Another general feature of the invention is a decoder for use with a lattice of a kind that can be defined as all integer N-tuples such that the ones, twos, ... coefficient N-tuples are codewords respectively in binary codes $(N, K_1)$, $(N, K_2)$, ... ,$(N, K_n)$, $n \geq 2$; the decoder comprises means for applying soft-decision decoding procedures applicable respectively to the binary codes (N, $K_i$), $1 \leq i \leq n$.

Preferred embodiments of the invention include the following features. The (N, $K_n$) code is an (N, N−1) single-parity-check code. The soft-decision decoding procedure for the single-parity-check code comprises means for making preliminary decisions on each coordinate of the single-parity-check code, means for checking parity of the preliminary decisions, and means for changing one of the preliminary decisions if the parity fails to check. The means for changing one of the preliminary decisions comprises means for identifying the coordinate where the preliminary decision was least reliable, and means for changing the preliminary decision in the least reliable coordinate. The lattice is a Leech half-lattice. One binary code is a Golay code, and another binary code is a single-parity-check code. $N_j=2$.

Other advantages and features of the invention will become apparent from the following description of the preferred embodiment, and from the claims.

DESCRIPTION OF THE PREFERRED EMBODIMENTS

We first briefly describe the drawings.

Drawings

FIGS. 13, 14 are block diagrams of a Leech lattice transmitter and receiver.

Structure and Operation

Figure 1:
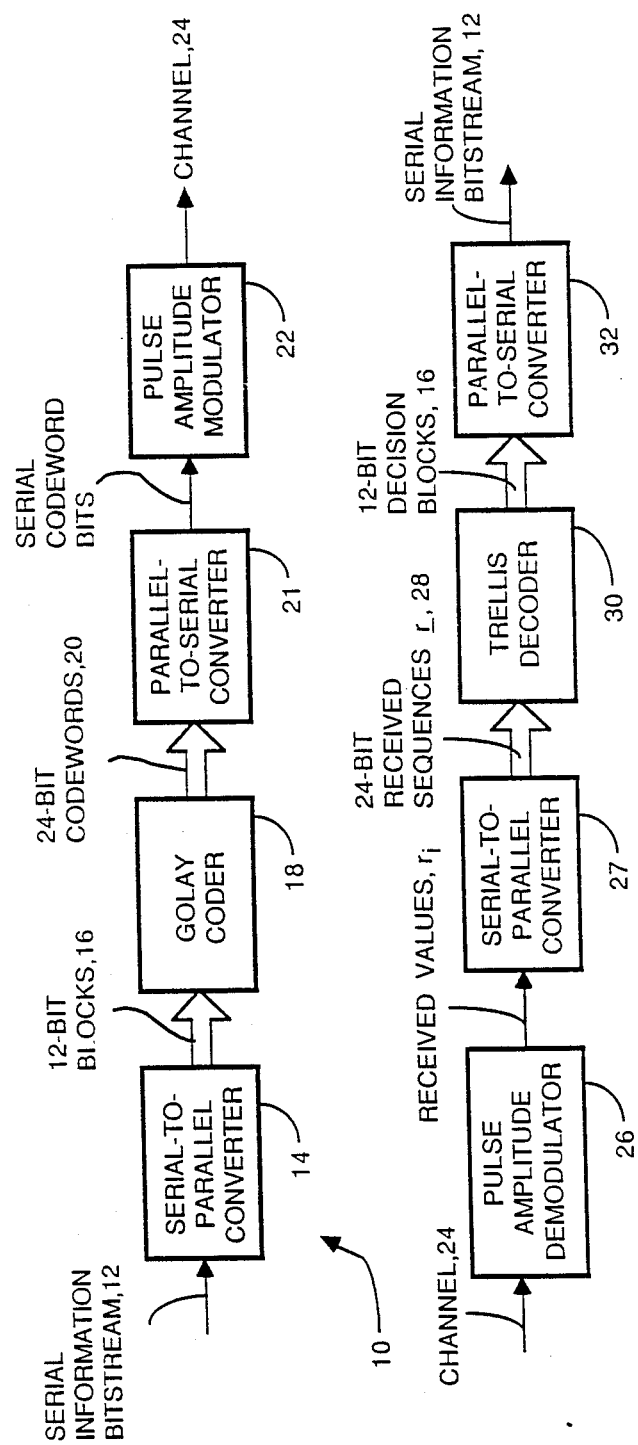
FIG. 1 is a block diagram of a communication system.

Referring to FIG. 1, in one preferred embodiment (using a Golay code), in transmitter 10 the bits appearing in a serial information bitstream 12 are grouped by a serial-to-parallel converter 14 into 12-bit blocks 16. Each block 16 is encoded by a Golay coder 18 into a 24-bit Golay codeword 20 from a set of possible Golay codewords (described below). Each codeword is then parallel-to-serial converted in converter 21 and transmitted by a sequence of 24 transmissions of a conventional binary pulse amplitude modulator 22 over a band-limited channel 24. Modulator 22 sends each "0" bit as one pulse level (e.g., +1), and each "1" bit as a second pulse level (e.g., −1).

At receiver 13, a conventional pulse amplitude demodulator 26 detects each of the 24 transmissions, producing a "soft decision" value $r_i$ for each symbol. The value $r_i$ can be any real number; typically the demodulator 26 is arranged so that $r_i$ is positive when "0" (+1) was sent, and negative when "1" (−1) was sent. The set of 24 successive values $r_i$ corresponding to the 24 transmissions is regarded as a single 24-tuple $r=(r_i, r_2, \ldots)$. A serial-to-parallel converter 27 converts the received bits, $r_i$, into parallel 2 4-bit sequences r 28 and a trellis (soft-decision) decoder 30 then decides which 12-bit block 16 was sent, given the received sequence r. Parallel-to-serial converter 32 then converts each decision block 16 in turn into a segment of the original serial information bitstream 12.

The Golay coder 18 maps the various 12-bit blocks into the corresponding 24-bit codewords by any appropriate technique.

Figure 2:
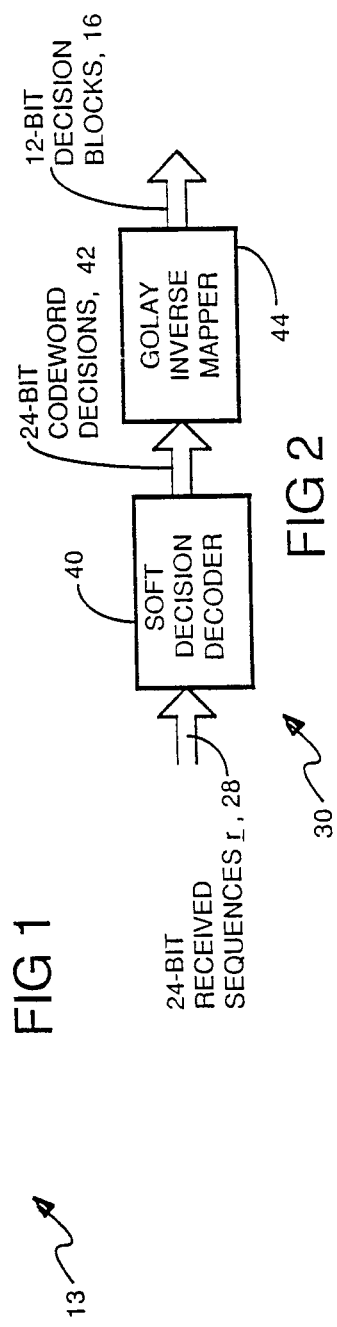
FIG. 2 is a block diagram of the trellis decoder of FIG. 1.

Referring to FIG. 2, trellis decoder 30 includes a soft-decision decoder 40 which generates 24-bit codeword decisions 42 using a trellis-decoding procedure (described below). Conventional Golay inverse mapper 44 then merely maps codewords into the 12-bit decision blocks 16, performing the inverse operation to Golay coder 18.

Trellis Decoding of the Golay Code

The Golay code is a known linear binary code of length 24, with 12 information symbols (bits) and thus $2^{12}=4096$ codewords, and with minimum (Hamming) distance between codewords of 8; i.e., in conventional notation it is a (24, 12, 8) code.

In accordance with the invention the codewords of such a code are represented by paths through a simple, regular trellis diagram.

In general, the size and complexity of the trellis diagram of a block code depend upon the ordering of the bits of the codewords. The bits of the Golay codewords, for example, are arranged in such a way that the simplest and most regular trellis diagram is obtained. This is done by regarding the 24-bit codewords as a series of three 8-bit subwords, or 8-tuples, and using a construction for the Golay code (i.e., an ordering of the codeword bits) that is related to a known construction called the Turyn construction (as described in MacWilliams and Sloane, *The Theory of Error Correcting Codes*, Chap. 18, ¶ 7.4, New York; North Holland, 1977), and which may be stated as follows:

We first define so-called generator matrices $G_{41}$ and $G'_{41}$ as the following $3 \times 8$ binary matrices:

$$G_{41} = \begin{bmatrix} 1100 & 1100 \\ 1010 & 1010 \\ 1111 & 0000 \end{bmatrix}$$

$$G'_{41} = \begin{bmatrix} 0111 & 1000 \\ 1001 & 1100 \\ 0101 & 0110 \end{bmatrix}$$

and $G_{10}$ as the all-ones 8-tuple [1111 1111]. $G_{41}$ and $G_{10}$ are together the generator matrix for the known (8,4) extended Hamming code (i.e., the 24 codewords of that Hamming code are the $2^4$ binary combinations of the four 8-tuples that make up $G_{41}$ and $G_{10}$) $G'_{41}$ is a permutation of the columns of $G_{41}$, and therefore with $G_{10}$ is the generator matrix for a permuted (8, 4) extended Hamming code. Further, $G_{41}$, $G'_{41}$, and $G_{10}$ together are a generator matrix for the (8, 7) single-parity-check code, i.e., the code of all even-weight 8-tuples.

Now the Golay codewords are defined as sequences of 3 8-tuples (x, y, z), where $$x = a + c + d$$

$$y = a + b + c + e$$

$$z = b + c + f$$

where
the sum "+" means bit-by-bit (modulo 2) addition of 8-tuples;
b are 8-tuples generated by $G_{41}$;
c is an 8-tuple generated by $G'_{41}$; and
d, e, and f are 8-tuples generated by $G_{10}$. Since there are $2^3 = 8$ possible 8-tuples a, b, and c, and $2^1 = 2$ possible 8-tuples (0 or 1) d, e, and f, there are $8 \times 8 \times 8 \times 2 \times 2 \times 2 = 2^{12} = 4096$ Golay codewords.

A generator matrix for the Golay code that reflects this definition is the following $12 \times 24$ matrix:

$$G = \begin{bmatrix} G_{41} & G_{41} & 0 \\ 0 & G_{41} & G_{41} \\ G'_{41} & G'_{41} & G'_{41} \\ G_{10} & 0 & 0 \\ 0 & G_{10} & 0 \\ 0 & 0 & G_{10} \end{bmatrix}$$

The Golay codewords are the $2^{12}$ binary linear combinations of the 12 rows of this matrix.

By defining the Golay code in this way, the codewords can be represented by a simple, regular 64-state trellis as follows.

Figure 3:
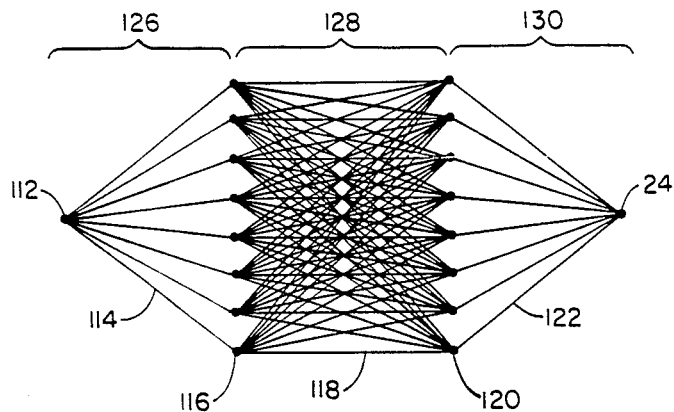
FIGS. 3, 4 are trellis diagrams related to the Golay code.

First, consider the $2^6$ codewords which are linear combinations of the first six rows of the matrix G. Each of these codewords is of the form (a, a+b, b), where a and b (and thus a+b) are each one of the $2^3 = 8$ 8-tuples generated by $G_{41}$. The 8-state trellis diagram of FIG. 3 can be used to represent the $2^6 = 64$ codewords.

From an initial node 112, there are 8 possible branches 114 leading respectively to the first set of 8 intermediate nodes or states 116, each of which corresponds to one of the 8 possible choices for the 8-tuple a. From each node in that first intermediate set, there are 8 possible branches 118 to a second set of 8 intermediate nodes 120, each of which corresponds to one of the 8 possible choices for b. The connecting branch 114 from a node a to a node b is associated with the 8-tuple a+b. Finally, there is only one branch 122 from each node of this second set of nodes to a final node 124, since the intermediate node 120 has already determined b. Thus there are a total of $2^6 = 64$ distinct paths in trellis 1 from the initial node 12 to the final node 24, each path corresponding to a sequence of three branches a, a+b, b. These paths therefore correspond respectively to the 64 codewords generated by the first 6 rows of G. The trellis has three "sections" 126, 128, 130 corresponding to the three 8-tuples.

Next, consider the $2^9$ codewords which are linear combinations of the first six and last three rows of G. Since $G_{10}$ is the all-ones 8-tuple 1, these codewords are the same as those represented by trellis 1, except that any 8-tuple may be replaced by its complement, namely the sum of that 8-tuple with 1, which is simply that 8-tuple with all bits complemented (inverted; i.e., $0 \leftrightarrow 1$). Thus in trellis 1 if each branch 114, 118, 122 is taken to represent two possible 8-tuples, namely the one described previously and its complement, then there become a total of $2^9$ possible paths from the initial node 112 to the final node 124, each path corresponding to a sequence of three branches a+d, a+b+e, and b+f.

Figure 4:
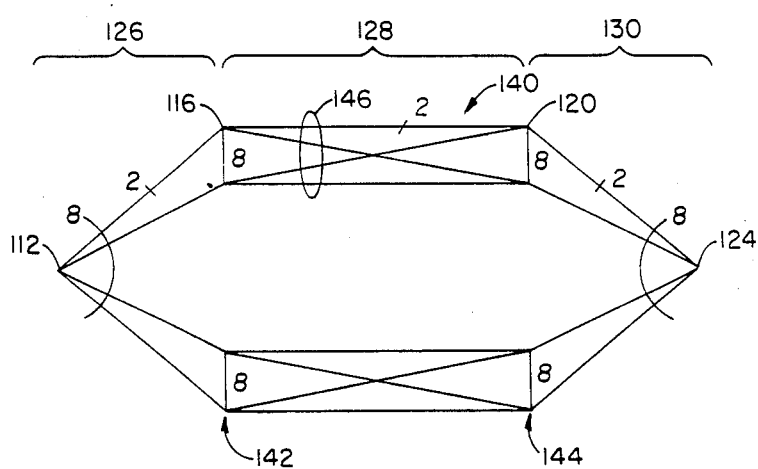

Finally, to represent all $2^{12}$ Golay codewords, take eight trellises of the form of trellis 1, each corresponding to one of the eight possible 8-tuples c generated by $G'_{41}$, and having branches as in trellis 1 except with c added to each 8-tuple, so that for a particular c the possible sequences of branches are a+c+d, a+b+c+e, b+c+f. The set of all paths through all these 8 trellises of the form of trellis 1 thus represents all $2^{12}$ Golay codewords. We can assemble the 8 trellises into a single trellis diagram by tying all 8 initial nodes and 8 final nodes together, thus arriving at a trellis 2, shown in schematic form in FIG. 4.

Trellis 2 comprises 8 schematically drawn subtrellises 140 (only two are shown) each corresponding to a trellis of the form of trellis 1. Each subtrellis 140 has 8 intermediate states 116 at each 8-tuple boundary 142, 144, so trellis 2 has 64 states in all at each such boundary. Within a subtrellis, there is a branch from each of the 8 first intermediate states to each of the 8 second intermediate states represented by the four lines 146. The "2" label on representative branches reminds us that each branch actually represents two 8-tuples, one the complement of the other.

Note that one would obtain a trellis diagram of the form of trellis 2 regardless of what matrices were chosen for $G_{10}$, $G_{41}$, and $G'_{41}$ in G, although only some of these matrices would in fact generate a Golay code (a (24, 12) code of minimum distance 8). In fact, one could develop a similar trellis for any code whose generator matrix could be put in the form $$G = \begin{bmatrix} A & 0 & 0 \\ 0 & A & 0 \\ 0 & 0 & A \\ B & B & 0 \\ 0 & B & B \\ C & C & C \end{bmatrix}$$

for any submatrices A, B, and C. The number of subtrellises would then be $2^{d_C}$, where $d_C$ is the dimension of C, the number of states in each subtrellis would be $2^{d_B}$, where $d_B$ is the dimension of B, and the number of paths represented by each branch would be $2^{d_A}$, where $d_A$ is the dimension of A.

In choosing the matrices that make up G, as in the case of the Golay code it is advantageous to have A be a generator matrix for a small code of large distance; A and B together be a generator matrix for a larger code of smaller distance, usually half that of the first; and A, B, and C together be a generator matrix for a still larger code of still smaller distance, typically one-half (or two-thirds) that of the previous code.

The construction could be further extended in a straightforward way to codes with generator matrices of the form $$G = \begin{bmatrix} A & O & O \\ O & A' & O \\ O & O & A'' \\ B & B' & O \\ O & B'' & B''' \\ C & C' & C'' \end{bmatrix}$$

where each submatrix is different.

Referring again to FIG. 2, soft decision decoder 40 tries to find the vector of 24 values (equal to ±1) in 24-space that represents a valid codeword c and is "closest" to the received vector r (i.e., the 24-bit received sequence 28), where the conventional measure of distance is the Euclidean distance $\|r-c\|^2$, i.e. the sum of the squares of the respective differences between the received values and the corresponding codeword coordinates ±1.

It is known that when the measure of distance is a coordinate-by-coordinate sum, as it is with Euclidean distance, the so-called Viterbi algorithm can be used to find the best Path through a trellis, i.e., the path c closest to the received vector r. The Viterbi algorithm may be applied to trellis 2 as follows:

Step (1). Find the "metrics" associated with each branch b. The metric may be taken as the minimum Euclidean distance $\|r-c\|^2$ in 8-space between r and the various 8-tuples represented by a given branch b; or it may be a "normalized" version of the metric that is scaled and translated in such a way as not to affect the relative metric rankings of branches in a given 8 coordinates. Efficient methods for computing such normalized branch metrics m(b) from the received vector r are described below.

Figure 5:
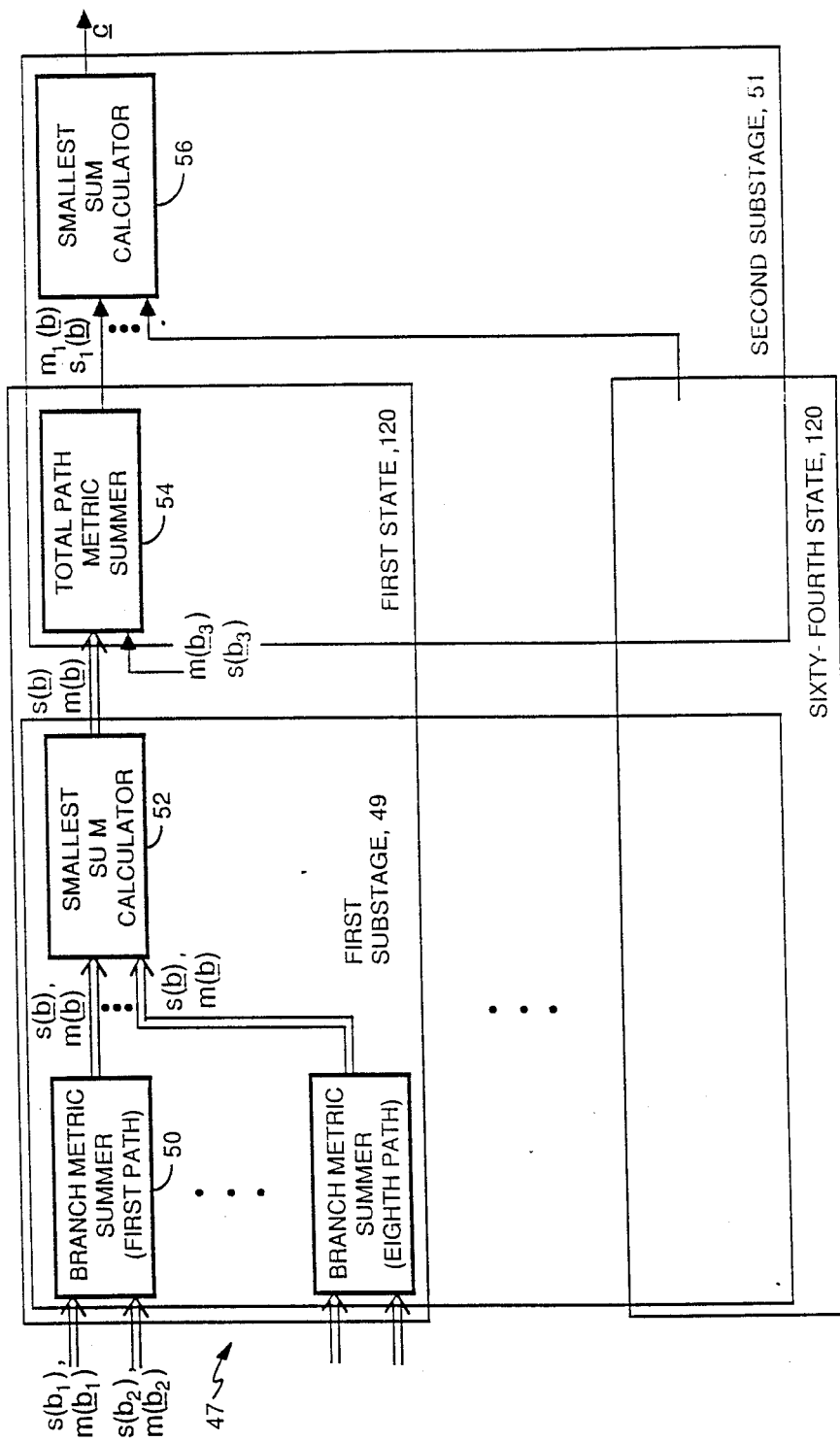
FIGS. 5, 7 are block diagrams of portions of the soft decision decoder of FIG. 2.
Figure 6:
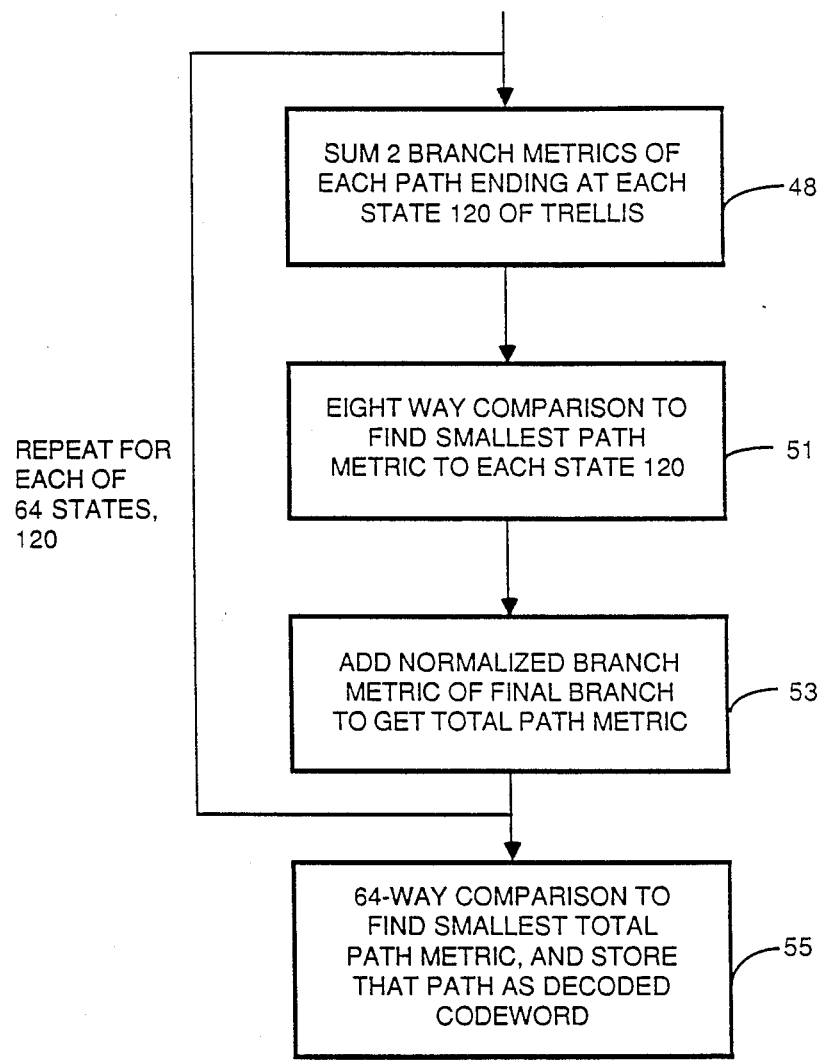
FIGS. 6, 8 are flow charts of the operation of the apparatus of FIGS. 5, 7.

Step (2). Find the shortest (smallest metric) path through the trellis by use of the Viterbi algorithm. In the case of the Golay code trellis (trellis 2), note that there are no path mergers at the end of the first section 126 (the fact that each branch represents two 8-tuples whose metrics must be compared is taken account of in the course of computing normalized branch metrics above); there are mergers of 8 paths at each of the 64 states at the end of the second section 128; and there is a merger of 64 paths at the final node 124. Referring to FIGS. 5, 6, the Viterbi algorithm may thus be applied in a second decoding stage 47 (the first decoding stage being associated with Step (1)) as follows:

(a) For each of the 64 states 120, . . . , 144 at the end of the second section 128 (i.e., for the so-called supersection made up of sections 126 and 128):

(i) For each of the 8 paths that merge at that state, as a first substage 49 of the second decoding stage sum (48, FIG. 6) the two corresponding normalized branch metrics $m(b_1)$, $m(b_2)$ (for the two branches that make up that path) in a branch metric summer 50 to obtain a normalized path metric m(b). Carry the corresponding survivor information $s(b_1)$, $s(b_2)$ through a combined survivor identifier s(b).

(ii) As another part of the second decoding stage, make (51, FIG. 6) an 8-way comparison (in a smallest sum calculator 52) to find the least of these 8 normalized path metrics, and store that path (S(b)) and its metric (M(b)) as the survivor for that state.

(iii) the first part of a second (and final) decoding substage 57, add the normalized branch metric $m(b_3)$ (in a total path metric summer 54) for the branch from that state to the final node to the survivor metric (M(b)) to get the total path metric $M_1(b)$ for the best path $S_1(b)$ through that state (53, FIG. 6).

(b) As a second (and final) part of the second (and final) decoding substage, make a 64-way comparison (in another smallest sum calculator 56) to find the least of these total path metrics, and store that path c as the final winner, corresponding to the decoded codeword (55, FIG. 6).

The total number of computations for the substeps of Step (2) is:

(a) (i): 64×8=512 two metrics;
(a) (ii): 64 8-way comparisons (equivalent to 64×7=448 binary comparisons);
(a) (iii): 64 additions of two metrics;
(b): one 64-way comparison (equivalent to 63 binary comparisons).

In summary, we need only 576 additions and the equivalent of 511 binary comparisons to find the shortest path through the trellis, given the normalized branch metrics. This is a modest number of computations that can readily be performed by a standard general-purpose microprocessor to implement the elements of FIG. 5. A microprocessor that can perform of the order of a million binary operations (additions or comparisons) per second can decode of the order of 1,000 codewords per second, or 12,000 bits per second.

The computation of all the needed normalized branch metrics is a task of comparable complexity and needs to be handled efficiently. In each section of the trellis there are a total of 128 possible 8-tuples (corresponding to the (8, 7) single-parity-check code generated by $G_{10}$, $G_{41}$, and $G'_{41}$). A straightforward approach would simply compute the Euclidean distance between the received values and each of these 128 8-tuples and then make a two-way comparison between each 8-tuple and its complement to find the better one, whose distance would then be taken as the corresponding branch metric. Such an approach turns out to require many more computations than finding the shortest path through the trellis. The following simplifications are therefore introduced:

1. The metrics are normalized so that the normalized metric of the ith coordinate $r_i$ of r can be obtained directly from the received value $r_i$ rather than by squaring a difference.

2. The metrics are further normalized so that the metrics of an 8-tuple and its complement are the same except for their signs, allowing replacement of 2-way comparisons by a simple check of the sign, and reducing the number of branch metrics to be computed in each section from 128 to 64.

3. The metrics are computed iteratively, first for 1-tuples (individual coordinates), then for 2-tuples, then for 4-tuples, and finally for 8-tuples, thus eliminating repetitions in computing partial metrics.

Figure 7:
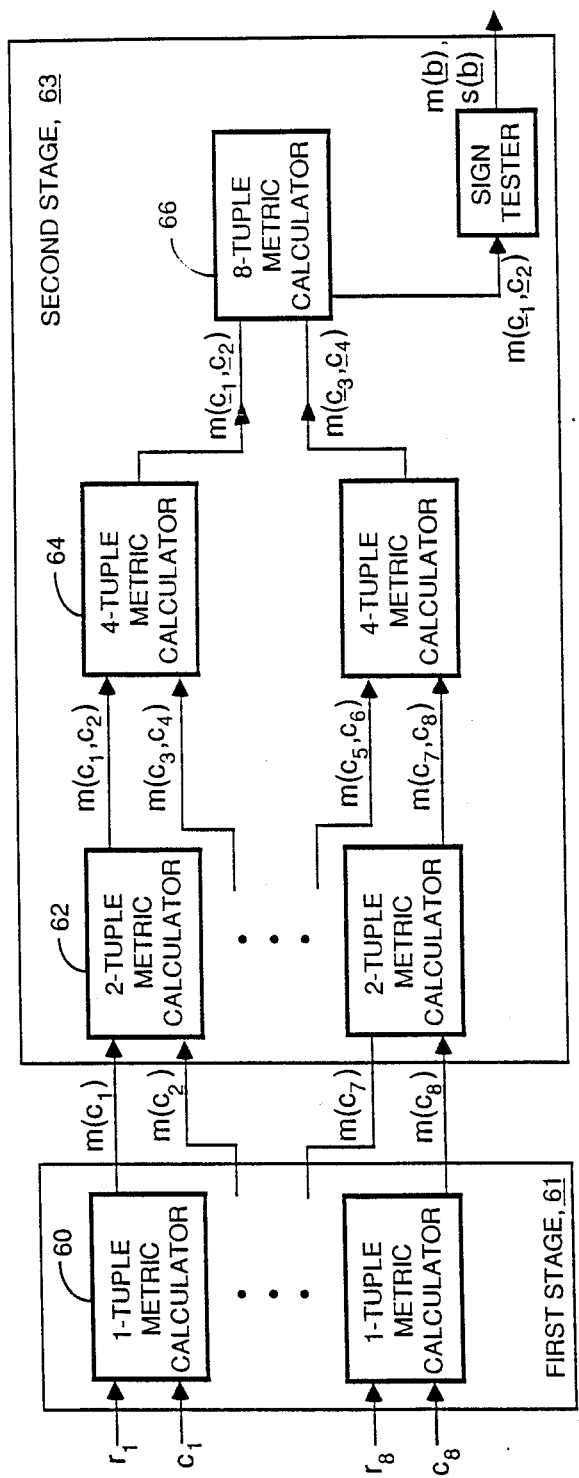
Figure 8:
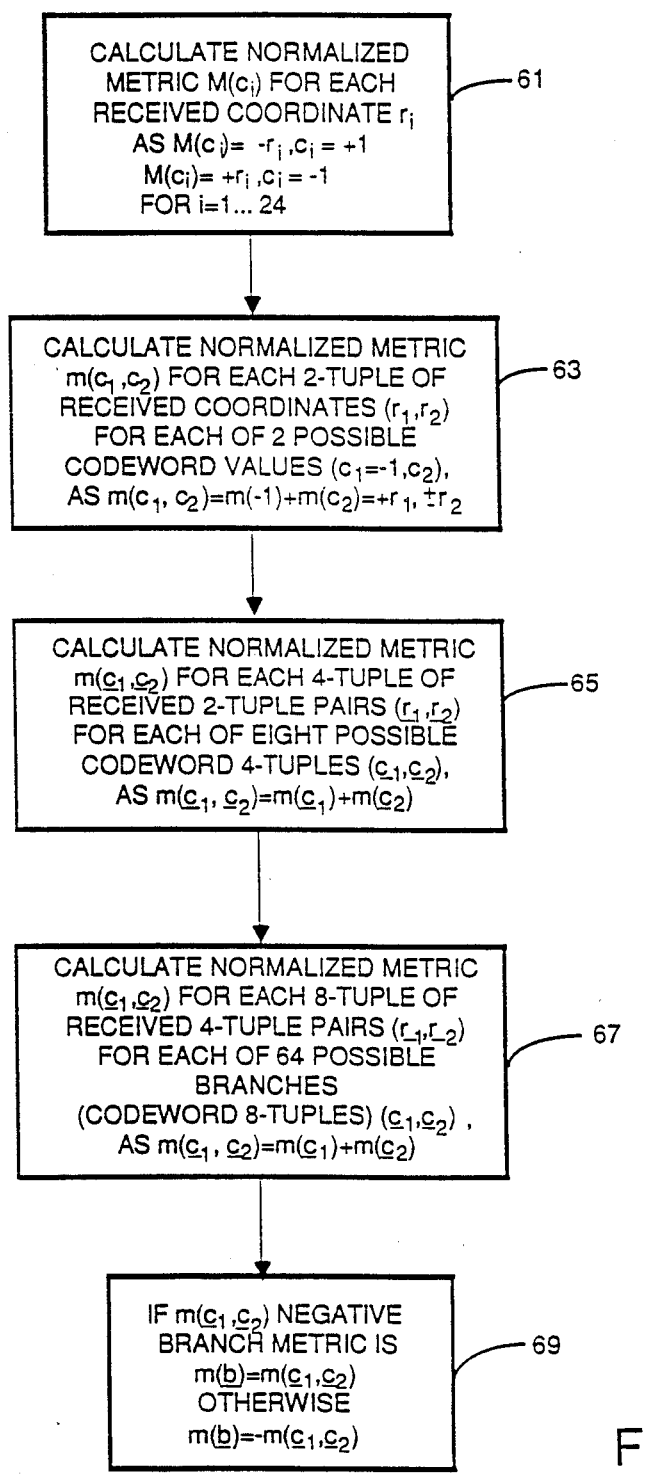

Referring to FIGS. 7, 8 the following procedure for the first decoding stage 59, Step (1) above embodies these simplifications.

(a) In a first stage of the metric calculation 61, treating each received coordinate $r_i$ as a section, then using a 1-tuple metric calculator 60, for each of the 24 received values $r_i$, $1 \leq i \leq 24$ (only those for the first 8-tuple are shown in FIG. 7), let the normalized metric $m(c_i)$ be $-r_i$ for $c_i = +1$ ("0") and $+r_i$ for $c_i = -1$ ("1") [61, FIG. 8]. Each metric calculator 60 represents a substage of this first stage 61. (Note: $(r_i-1)^2 - (r_i+1)^2 = -4r_i$, so this normalization preserves the difference of the squared distances from $r_i$ to +1 and −1, up to a scale factor of 2. Also, since the objective is to find the minimum distance or metric, a negative metric is "better" than a positive one.)

(b) In a second stage 63, for each of the 12 2-tuples of received values ($r_1$, $r_2$), for each of the 2 possible codeword values ($c_1 = -1$, $c_2$) (corresponding to two of the possible bit pairs), compute (in a 2-tuple metric calculator 62, only four of which are shown in FIG. 7) the normalized metric $m(c_1, c_2) = m(-1) + m(c_2) = +r_1 \pm r_2$ (63, FIG. 8). (The normalized metrics for the other 2 possible codeword values ($c_1 = +1$, $c_2$) are the negatives of these: $m(+1, \bar{c}_2) = -m(-1, c_2) = -r_1 \pm r_2$, where $\bar{c}_2$ is the complement of $c_2$.)

(c) As part of second stage 63, for each of the 6 4-tuples of received values, represented as pairs ($r_1$, $r_2$) of 2-tuples, for each of the 8 possible codeword 4-tuples ($c_1$, $c_2$) and their complements (corresponding to the 16 possible bit 4-tuples) compute (in a 4-tuple metric calculator 64, only two of which are shown in FIG. 7) the normalized metrics $m(c_1, c_2) = m(c_1) + m(c_2)$ (65, FIG. 8); the normalized metrics for the complements may be obtained by inverting signs.

(d) As another part of the second stage 65, for each of the 3 8-tuples of received values, represented as pairs ($r_1$, $r_2$) of 4-tuples, for each of the 64 possible branches b, each corresponding to a codeword 8-tuple ($c_1$, $c_2$) and its complement ($\bar{c}_1, \bar{c}_2$) (corresponding to the 128 even-weight binary 8-tuples) compute (in an 8-tuple metric calculator 66, only one of which is shown in FIG. 7) the normalized metrics $m(c_1, c_2) = m(c_1) + m(c_2)$ (67, FIG. 8). Test the sign of $m(c_1, c_2)$ in a sign tester 68; if it is negative, then ($c_1, c_2$) is the better 8-tuple for that branch, and the branch metric is $m(b) = m(c_1, c_2)$; if it is positive, then the complement ($\bar{c}_1, \bar{c}_2$) is the better 8-tuple for that branch, and the branch metric is $m(b) = m(\bar{c}_1, \bar{c}_2) = -m(c_1, c_2)$ [69, FIG. 8]. (In other words, the branch metric $m(b)$ is the negative of the absolute value of $m(c_1,c_2)$.) Each of the 2-tuple, 4-tuple, and 8-tuple calcuators represents a substage of stage 63. Store the branch metric $m(b)$ and an indication ($s(b)$) of which one of the complement pair was the winner.

In this metric calculation each 1-tuple can be considered a section of the trellis and each 2-tuple, 4-tuple, and 8-tuple a supersection formed by combining two parts that are either sections or previously formed supersections. Alternatively, 2-tuples or 4-tuples could be considered to be the basic sections of the trellis, and their combinations as the supersections.

This procedure can also be executed on a general purpose microprocessor. Given the received values, $r_i$, $1 \leq i \leq 24$, the total number of computations for the substeps of Step (1) are:

(a) No computation required;
(b) $12 \times 2 = 24$ additions/subtractions of two metrics;
(c) $6 \times 8 = 48$ additions/subtractions of two metrics;
(d) $3 \times 64 = 192$ additions/subtractiosn of two metrics, plus 64 sign tests and possible sign conversions.

In total, therefore, the procedure requires 264 additions/subtractions of two numbers, and 64 sign tests/absolute values. This is now substantially less than what is needed for Step (2), so that Step (1) could be executed in the same general-purpose microprocessor without greatly increasing its load (total of $576 + 511 + 264 = 1351$ arithmetic operations).

Figure 9:
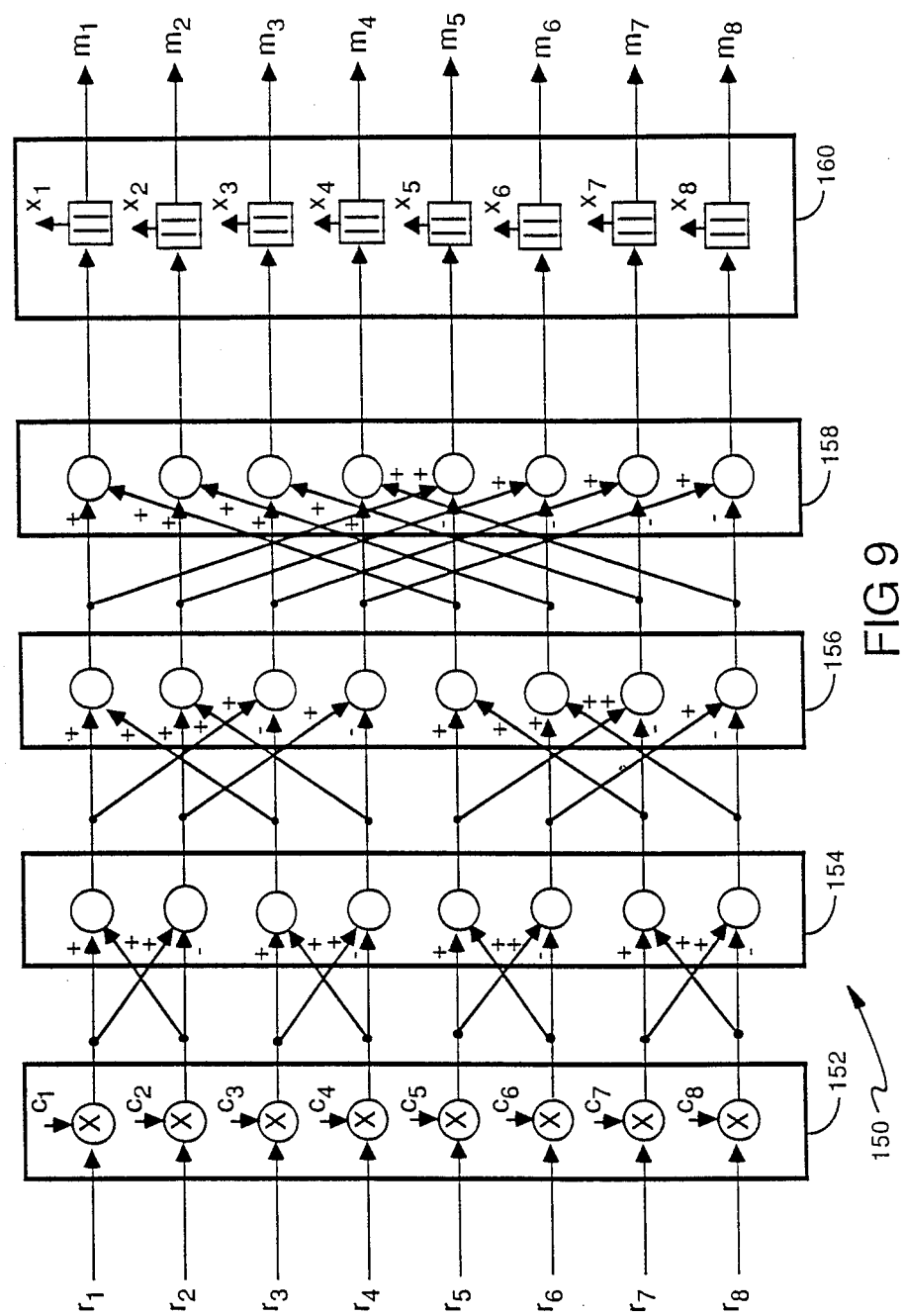
FIG. 9 is a block diagram of branch metric calculator hardware.

Alternatively, parts or all of the procedure can be efficiently executed with relatively simple circuitry. In FIG. 9, a branch metric computer 150 generates from a received value 8-tuple r ($r_1$, $r_2$, $r_3$, $r_4$, $r_5$, $r_6$, $r_7$, $r_8$) and a binary 8-tuple c ($c_1$, $c_2$, $c_3$, $c_4$, $c_5$, $c_6$, $c_7$, $c_8$) a set of 8 outputs representing the normalized metric $m_i$, $1 \leq i \leq 8$, for the 8 branches $a_i + c$, for all 8 possible 8-tuples $a_i$, $1 \leq i \leq 8$, generated by the matrix $G_{41}$. (Such groups of 8 branches appear, for example, in the first and third sections of any of the subtrellises of trellis 2; in the second section, the group of 8 branches coming from any given state or going to any given state are also such a set.) The circuit also generates 8 bits $x_i$, $1 \leq i \leq 8$, representing for each branch whether the 8-tuple represented by $a_i + c$ or by its complement is better.

In FIG. 9, the eight received values $r_i$ first go through sign inverters 152, where their respective signs are inverted if the corresponding component of the binary 8-tuple c is a "1". The 8 outputs then go through three stages of adders/subtractors 154, 156, 158 as shown (in effect computing a Fast Hadamard Transform), the outputs of which are the normalized metrics of the 8-tuple $a_i + c$. Absolute value takers 160 put out binary numbers $x_i$ representing, respectively, the signs of each of these normalized metrics, indicating whether $a_i + c$ or its complement is closer to r, and also put out branch metrics $m_i$ which are the absolute values of these normalized metrics (which may now be taken to be positive, so that larger metrics are better).

Figure 10:
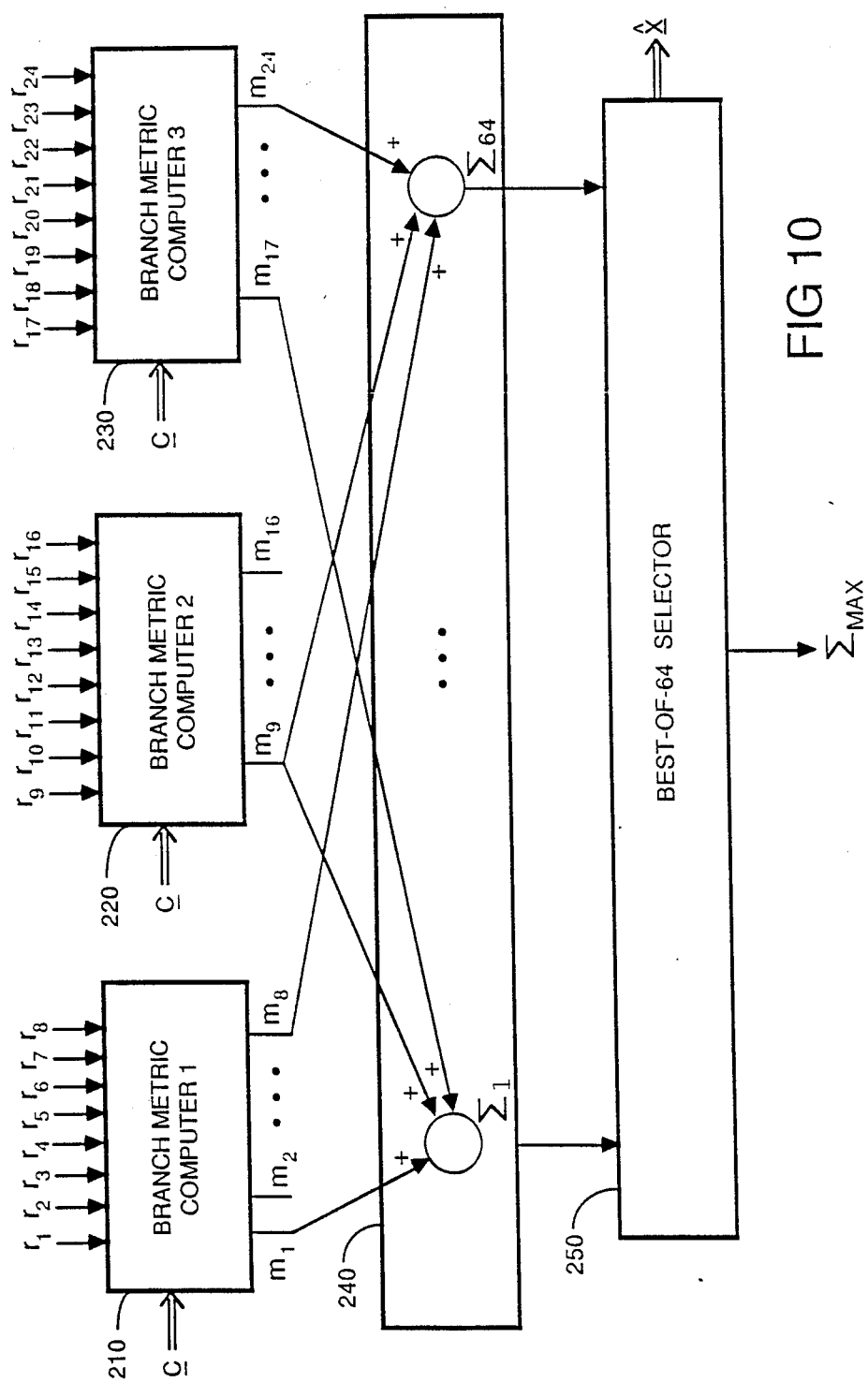
FIG. 10 is a block diagram of parallel subtrellis decoder hardware.

Branch metric computers of the kind shown in FIG. 9, may be used repeatedly to generate all necessary branch metrics, or combined in parallel for faster operation. FIG. 10 illustrates a parallel configuration that finds the best path through one of the 8 subtrellises of trellis 2 (i.e., a trellis of the form of trellis 1) in a single operation. Three branch metric computers 210, 220, 230 are used, one for each of the three received value 8-tuples $r_1$, $r_2$, and $r_3$, and all using as the binary 8-tuple input the same binary 8-tuple c that is associated with the subtrellis. Each computer generates an 8-tuple of branch metric outputs ($m_1 \ldots m_8$), ($m_9 \ldots m_{16}$), ($m_{17} \ldots m_{24}$). Sixty-four sums $\Sigma_i$, $1 \leq i \leq 64$ of three branch metrics are formed in adders 240, each corresponding to one of the 64 possible paths (a+c, a+b+c, b+c) through the trellis (note that a, a+b, and b are all 8-tuples generated by $G_{41}$ so that all necessary branch metrics are available). A comparator 250 selects the largest of these 64 sums, and the 9 bits x representing the best path through the c subtrellis are delivered as an output for storage (3 bits for a, 3 bits for b, and 1 bit for each of the three sections to tell whether a complement was selected). The best metric $\Sigma_{max}$ is also delivered as an output for storage.

Operation of the parallel subtrellis decoder of FIG. 10 8 times, once for each possible value of c (i.e., for each possible subtrellis), and comparison of the resulting metrics $\Sigma_{max}$ will determine the best metric of all; the decoded word then has 3 bits representing the winning c value and the remaining 9 bits determined by the subtrellis decoder which used that c. Since only combinational logic is used in the branch metric computer and parallel subtrellis decoder, clock rates of the order of 1 MHz are readily attainable, which would support bit rates of the order of 1 Mbps.

Decoding the Leech Lattice via Trellis Decoding

Another embodiment is useful for communication systems that use Leech lattice points. The Leech lattice is a 24-dimensional lattice that is closely related to the Golay code. Copending U.S. patent application Ser. No. 629,110, Longstaff et al., filed July 9, 1984, and incorporated herein by reference, describes a high-speed (up to 19,200 bits per second) modem whose "signal constellation" comprises a large number (up to $2^{97}$) of 24-dimensional "signal points", each signal point representing a 24-tuple from the Leech lattice. (The signal points are actually sent and received in 12 successive signaling intervals in a conventional 2-dimensional QAM modem.) Because of the high density of Leech lattice points in 24-space, a "coding gain" of the order of 6 dB is obtained compared with conventional (uncoded) QAM modulation. Detection of received 24-tuples (i.e., decoding into Leech lattice points) is, however, very complex. In the embodiment described in the Longstaff and Lang application, an exhaustive comparison is made with $2^{13} = 8192$ "pattern vectors". More recently, Conway and Sloane, "Decoding Techniques for Codes and Lattices, Including the Golay Code and the Leech Lattice", have developed a somewhat simpler procedure for full maximum likelihood decoding. The first decoding method to be described here is of the order of four times less complex than that of Conway and Sloane. A second decoding procedure, which is only slightly suboptimum, is of the order of five times less complex than the first.

A lattice decoder may also be used as a multi-dimensional quantizer. Given a 24-dimensional vector r, the closest Leech lattice point may be taken as a quantized version of r. The decoding procedure to be given here may be used in such applications as well.

Again, the foundation of the procedure is to represent the lattice points by a trellis diagram.

To develop a trellis diagram for the complex Leech lattice, we begin with a conventional description of the Leech lattice. The Leech lattice may be taken to be a 24-dimensional integer lattice, i.e., a lattice with its points which are 24-tuples k of integers $k_i$, $1 \leq i \leq 24$. Each integer $k_i$ may be expressed in standard binary form as $k_i = a_i + 2b_i + 4c_i + \ldots$, where $a_i$, $b_i$, $c_i$, are binary numbers (either 0 or 1), and are called the ones-coefficients, twos-coefficients, fours-coefficients, and so forth. Correspondingly, we write the 24-tuple k as $a + 2b + 4c + \ldots$, where a is called the ones-coefficient 24-tuple, etc. Now an integer 24-tuple k is a Leech lattice point if and only if (a) its ones-coefficient 24-tuple a is either all-zeros or all-ones. (In the former case, k is called even; in the latter, odd.)

(b) its twos-coefficient 24-tuple b is a codeword from the Golay code. (It is beneficial to use the representation of the Golay code already discussed, and in particular the same coordinate ordering and division into three sections.)

(c) its fours-coefficient 24-tuple c has an even number of ones if k is even, and an odd number if k is odd.

All other coefficients may be chosen arbitrarily.

An equivalent definition of Leech lattice points is the following. An integer 24-tuple k is a Leech lattice point if an only if it is congruent (modulo 8) to the sum (modulo 8) $a + 2b + 4c$, where (a) a is either all zeros or else is a 24-tuple with an odd number of ones coordinates and an odd number of coordinates equal to 5—for example, the vector (q, q, q), where q is the 8-tuple [b 5111 1111].

(b) b is a Golay codeword;

(c) c is an even-weight binary codeword; i.e., a word from the single-parity-check (24, 23) code consisting of all even-weight 24-tuples.

In general, an N-dimensional lattice is said to be equivalent to a given N-dimensional lattice if it can be obtained from the given lattice by any combination of operations involving scaling, rotation, and translations in N-space. Many useful dense lattices are equivalent to integer lattices. Any lattice equivalent to the integer lattice specified above is called a Leech lattice.

The Leech lattice formulation given above leads to the specification of a "generator matrix" $G_L$ (this is not the conventional mathematical terminology) for the Leech lattice that has the following rows:

(a) one row equal to (q, q, q) as just defined;

(b) 12 rows equal to the rows of the generator matrix G of the Golay code defined above, multiplied by 2;

(c) 23 rows equal to the rows of a generator matrix for the (24, 23) code, multiplied by 4. For the purposes of developing a trellis diagram, these rows are organized carefully in the following way:

$$G_L = \begin{bmatrix} G_8 & 0 & 0 \\ 0 & G_8 & 0 \\ 0 & 0 & G_8 \\ G_4 & G_4 & 0 \\ 0 & G_4 & G_4 \\ G'_4 & G'_4 & G'_4 \end{bmatrix}$$

where $$G_8 = \begin{bmatrix} 4400 & 0000 \\ 4040 & 0000 \\ 0044 & 0000 \\ 4000 & 4000 \\ 0000 & 4400 \\ 0000 & 4040 \\ 0000 & 0044 \\ 2222 & 2222 \end{bmatrix}$$

$$G_4 = \begin{bmatrix} 4000 & 0000 \\ 2200 & 2200 \\ 2020 & 2020 \\ 2222 & 0000 \end{bmatrix}$$

$$G'_4 = \begin{bmatrix} 0222 & 2000 \\ 2002 & 2200 \\ 0202 & 0220 \\ 5111 & 1111 \end{bmatrix}$$

$G_L$ has a total of 36 rows and is composed of 8-tuple submatrices $G_8$ ($8 \times 8$), $G_4$ ($4 \times 8$), and $G'_4$ ($4 \times 8$), in a similar fashion to the composition of G by $G_{10}$, $G_{41}$, and $G'_{41}$. The $2^{36}$ binary linear combinations (modulo 8) of the give all of the Leech lattice points with coordinates $k_i$ in the range $0 \leq k_i \leq 7$; the entire Leech lattice consists of all points that are congruent to this finite set of points, modulo 8.

Figure 11:
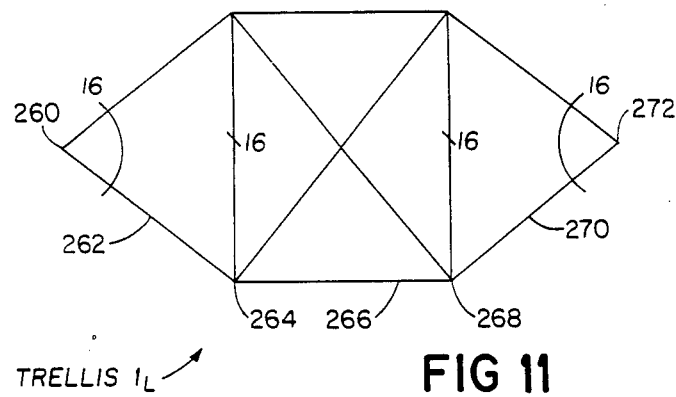
FIGS. 11, 12, 17, 18, 19 are trellis diagrams related to the Leech lattice.

As in the case of the Golay code, this form of generator matrix can be used to develop a simple, regular 3-section trellis, in this case with 256 states. First, consider the 8 rows that involve the submatrix $G_4$. The $2^8 = 256$ 24-tuples that are binary linear combinations of these rows (modulo 8) can be represented by the 16-state trellis diagram $1_L$ shown in FIG. 11, which is analogous to trellis 1. The notation of FIG. 11 indicates that: from the initial node 260 there are 16 possible branches 262 (the $2^4$ 8-tuples generated by $G_4$) leading to a first set of 16 intermediate nodes or states 264; from each intermediate state 264 there are 16 branches 266 leading to a second set of intermediate nodes or states 268; and from each such state there is a branch 270 leading to a final node 272. If a first state 264 is reached by a branch 262 corresponding to the 8-tuple a, and a second state 268 is connected to the final node by a branch 270 corresponding to the 8-tuple b, then the branch 266 connecting these first and second states corresponds to the 8-tuple a+b (modulo 8). Thus there are $2^8 = 256$ distinct paths in trellis $1_L$ from the initial node to the final node, each path corresponding to a series of three 8-tuples a, a+b, b, and these are the 256 Leech lattice points generated by the 8 rows of G involving $G_4$.

Next, consider the $2^{32}$ Leech lattice points which are binary linear combinations (modulo 8) of the first 32 rows of $G_L$; i.e., those involving $G_8$ as well binary linear combinations of the matrix $G_8$ (modulo 8) are a set of 256 8-tuples that may be added (modulo 8) to any branch in the trellis to generate these $2^8 \times 2^8 \times 2^8 \times 2^8$ points. That is, these $2^{32}$ points have the form (a+d, a+b+e, b+f), where a and b are each any of the $2^4$ 8-tuples generated by $G_4$, and d, e, and f are each any of the $2^8$ 8-tuples generated by $G_8$. Thus if we regard any branch in trellis $1_L$ as representing a total of 256 Leech lattice points—namely, a base 8-tuple a, a+b, or b, plus any of the $2^8$ 8-tuples generated by $G_8$—then all the paths through trellis $1_L$ represent this set of $2^{32}$ Leech lattice points.

Figure 12:
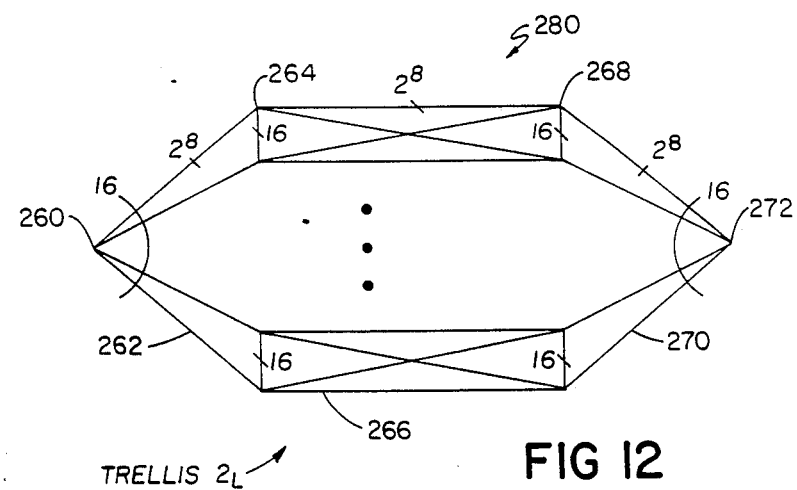

Finally, to obtain all $2^{36}$ Leech lattice points (with coordinates in the range from 0 to 7), we take 16 trellises of the form of trellis $1_L$, each corresponding to one of the 16 possible 8-tuples c generated by $G'_4$, and having branches as in trellis $1_L$ except with c added to each 8-tuple, so that for a particular c the possible sequences of branches are a+c+d, a+b+c+e, b+c+f (all sums modulo 8). The set of all paths through all these 16 trellises represents all $2^{36}$ Leech lattice points (modulo 8). As before, these sixteen trellises are assembled into a single trellis diagram by tying the initial and final nodes together, thus arriving at the trellis diagram $2_L$ shown schematically in FIG. 12. The notation of FIG. 12 means that (a) trellis $2_L$ comprises 16 subtrellises 280, each of the form of trellis $1_L$; (b) each subtrellis 280 has 16 intermediate states 264 at each section boundary, so trellis $2_L$ has 256 states at each section boundary; (c) within a subtrellis, there is a branch 266 from each of the 16 first intermediate states 264 to each of the 16 second intermediate states 268; d) the "$2^8$" labels remind us that each branch 262, 266, 270 actually represents 256 8-tuples, a base branch plus the set of $2^8$ 8-tuples generated by $G_8$.

Again, a trellis diagram of the form of trellis $2_L$ would be the result regardless of what matrices A, B, C were substituted for $G_8$, $G_4$, and $G'_4$, or indeed if every nonzero submatrix in $G_L$ were different (but of compatible dimensions). Preferably A is itself the generator of a dense lattice (in this case one called $2E_8$), B and A together generate a dense lattice (in this case one called $RE_8$), with less (typically by a factor of $\frac{1}{2}$) squared distance between points compared to the lattice generated by A; and C, B, and A together generate a dense lattice (in this case one called $E_8$) with still less (typically by a factor of $\frac{1}{2}$ or $\frac{2}{3}$) squared distance between points.

An example of this principle that is particularly relevant to the Leech lattice case can be illustrated by rotating Leech lattice points in 24-space into an equivalent lattice as follows. Replace each pair (x, y) of coordinate values of each Leech lattice point by the pair of values (x+y, x−y). (This amounts to a 45° rotation and scaling up by $\sqrt{2}$ in each set of two dimensions.) Since each Leech lattice point is a unique combination of the rows of $G_L$ (modulo 8), the effect of this rotation on all points can be determined by examining its effect on the generators (rows of $G_L$), which in turn is determined by its effect on the rows of $G_8$, $G_4$, and $G'_4$. We have $$G_8 \to RG_8 = \begin{bmatrix} 8000 & 0000 \\ 4444 & 0000 \\ 0080 & 0000 \\ 4400 & 4400 \\ 0000 & 8000 \\ 0000 & 4444 \\ 0000 & 0080 \\ 4040 & 4040 \end{bmatrix} = \begin{bmatrix} 4444 & 0000 \\ 4400 & 4400 \\ 0000 & 4400 \\ 4040 & 4040 \end{bmatrix} \text{(modulo 8)}$$

$$G_4 \to RG_4 = \begin{bmatrix} 4400 & 0000 \\ 4000 & 4000 \\ 2222 & 2222 \\ 4040 & 0000 \end{bmatrix}$$

$$G'_4 \to RG'_4 = \begin{bmatrix} 2 & -24 & 0 & 2200 \\ 2 & 22 & -2 & 4000 \\ 2 & -22 & -2 & 2222 \\ 6 & 42 & 0 & 2020 \end{bmatrix} =$$

$$\begin{bmatrix} 2640 & 2200 \\ 2226 & 4000 \\ 2626 & 2622 \\ 6420 & 2020 \end{bmatrix} \text{(modulo 8)}$$

We have discarded the four rows with a single 8 from $RG_8$ because they are congruent to zero (modulo 8). Consequently, (a) the generator matrix $RG_L$ for the rotated Leech lattice, in which $G_8$, and $G_4$, and $G'_4$ are replaced by $RG_8$, $RG_4$, and $RG'_4$, has only 24 rows, not 36; and (b) the trellis corresponding to this matrix has only $2^4$ 8-tuples represented by each branch rather than $2^8$, and is to that extent simplified, although its form is unchanged.

Furthermore, since all rows are now even, all coordinates may be divided by two, and the "modulo 8" accordingly is replaced by "modulo 4".

In summary, a 24-row generator matrix $RG_L$ for the rotated Leech lattice has been defined such that an integer 24-tuple is a rotated Leech lattice point if and only if it is congruent (modulo 4) to one of the $2^{24}$ binary linear combinations of the rows of $RG_L$.

$$RG_L = \begin{bmatrix} A & O & O \\ O & A & O \\ O & O & A \\ B & B & O \\ O & B & B \\ C & C & C \end{bmatrix}$$

$$A = \begin{bmatrix} 2222 & 0000 \\ 2200 & 2200 \\ 0000 & 2222 \\ 2020 & 2020 \end{bmatrix}$$

$$B = \begin{bmatrix} 2200 & 0000 \\ 2020 & 0000 \\ 2000 & 2000 \\ 1111 & 1111 \end{bmatrix} \text{(all modulo 4)}$$

$$C = \begin{bmatrix} 1320 & 1100 \\ 1113 & 2000 \\ 1313 & 1311 \\ 3210 & 1010 \end{bmatrix}$$

As noted in the Longstaff and Lang patent application, the 24 coordinates of a Leech lattice signal point may be sent by 12 successive signaling intervals in a conventional 2-dimensional QAM modem; they could also be sent by 24 conventional multilevel PAM signals, similarly to FIG. 1, or by other conventional means. In any case, the Leech lattice decoding problem (maximum likelihood decoding) is to find the closest Leech lattice point to a 24-tuple of received values r, which may be taken as soft-decision outputs of a conventional modem, similar to FIG. 1. (This is also the problem in building a Leech lattice quantizer, as noted earlier.)

Referring to FIG. 13, transmitter 10 includes a Leech lattice coder 70 that codes bits into lattice points 72, a parallel-to-serial converter 73 that converts the points into 12 pairs of integers in any conventional manner (e.g., see the Longstaff and Lang application), and a quadrature amplitude modulator 74 that transmits 12 corresponding 2-dimensional signal points.

Referring to FIG. 14, receiver 13 would then include a quadrature amplitude demodulator 78 to generate 12 corresponding pairs of received signal points, a serial-to-parallel converter 79 to convert each point into the 24-coordinate received sequence r 80, a soft decision decoder 82 to determine a decoded Leech lattice point, a Leech lattice inverse mapper 84 to map that point back into bits, and a parallel-to-serial converter 85 to deliver the serial information bitstream 12.

The Leech lattice point may be one generated by the matrix $G_L$ or by the rotated matrix $RG_L$. In the former case, each pair of components in the received value 24-tuple r may be rotated by the operation (x, y)→½(x+y, x−y) so that the transmitted point may be regarded as one generated by $RG_L$, which is generally preferable for simpler decoding. More generally, if a Leech lattice is defined with coordinates permuted from those given here, then (referring to FIGS. 15, 16) as a first step in the receiver we perform (using an $RG_L$ permuter 90) the inverse permutation; or if a Leech lattice point is defined in any way whatsoever (i.e., if any lattice equivalent to the rotated Leech lattice is used), then the appropriate orthogonal transformation is made so that points may be regarded as having been generated by $RG_L$ (91, FIG. 16). The Leech lattice decoding problem is then solved by using a procedure such as the Viterbi algorithm to find the best path through the trellis that has been shown to be associated with $RG_L$.

Figure 16:
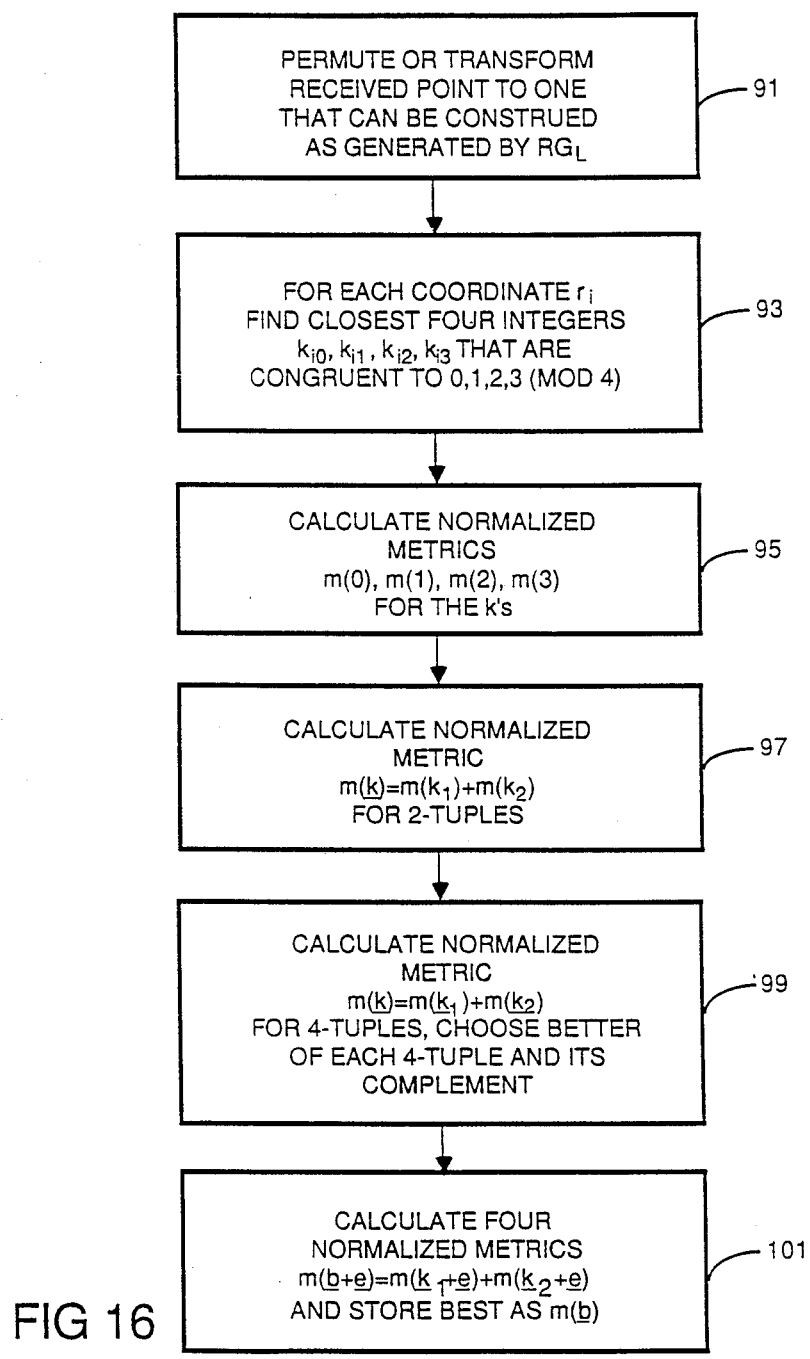
FIG. 16 is a flow chart of the operation of the apparatus of FIG. 15.

The first step in decoding (using a 1-tuple metric calculator 92) is to find, for each received coordinate value $r_i$, the four integers $k_{i0}$, $k_{i1}$, $k_{i2}$, and $k_{i3}$ which are the closest integers to $r_i$ that are congruent to 0, 1, 2, and 3 (modulo 4), respectively (93, FIG. 16). (This is one reason for preferring $RG_L$; if $G_L$ were used, in principle 8 integers would have to be found in the respective residue classes (modulo 8).) If $k_i = r_i$ is the greatest integer not greater than $r_i$, then these four integers are $k_i - 1$, $k_i$, $k_i + 1$, and $k_i + 2$. An appropriate set of normalized metrics is obtained by subtracting $(r_i - k_i)^2$ from the four squared distances from $r_i$ to each of these integers, resulting in the normalized metrics $2e_i + 1$, 0, $-2e_i + 1$, and $-4e_i + 4$, respectively, where $e_i = r_i - k_i$. If we define $e'_i = 1 - e_i$, this can be put in the more symmetrical form $3e$, $-e'_i$, $-e_i$, and $3e'_i$ by subtracting $e'_i$ from each metric. We denote the normalized metrics for $k_{i0}$, $k_{i1}$, $k_{i2}$, and $k_{i3}$ as $m(0)$, $m(1)$, $m(2)$, and $m(3)$.

The next step is to compute normalized branch metrics $m(b)$ for each of the branches b that appear in the trellis for $RG_L$. Again, it is important to organize this computation efficiently, or it will dominate the overall computational complexity.

Recall that each branch represents 16 different 8-tuples. From the definition of $RG_L$, it is apparent that these 8-tuples are of the form b+e, where b is a "base branch" generated by the rows of B and C, modulo 4, or $$G_b = \begin{bmatrix} 2200 & 0000 \\ 2000 & 2000 \\ 1111 & 1111 \\ 2020 & 0000 \\ 1320 & 1100 \\ 1113 & 2000 \\ 1313 & 1311 \\ 3210 & 1010 \end{bmatrix} \text{(modulo 4)}$$

or equivalently by $$G'_b = \begin{bmatrix} 1111 & 0000 \\ 1100 & 1100 \\ 1010 & 1010 \\ 0000 & 1111 \\ 2000 & 0000 \\ 0000 & 2200 \\ 0000 & 2020 \\ 0000 & 2000 \end{bmatrix} \text{(modulo 4)}$$

while e may be any of the set of 16 8-tuples generated by $$A = \begin{bmatrix} 2222 & 0000 \\ 2200 & 2200 \\ 2020 & 2020 \\ 0000 & 2222 \end{bmatrix} \text{(modulo 4)}$$

Figure 17:
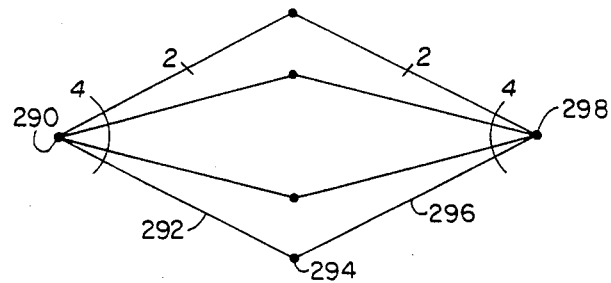

It is helpful to construct trellis diagrams for these 8-tuples. The set of 16 8-tuples generated by A may be represented by the simple 4-state trellis diagram, trellis 3, shown in FIG. 17. Trellis 3 illustrates that the 8-tuples generated by A consist of 16 4-tuple pairs (a+b, a+c), where (a) a is one of the four 4-tuples that are the binary linear combinations of [2020] and [2200];
(b) b and c are each either [0000] or [2222];
(c) all additions are modulo 4.

From an initial node 290, there are four possible branches 292 to the 4 states 294, each corresponding to a 4-tuple, and from each state 294 there is one branch 296 to a final node 298, also corresponding to a. Each branch represents two 4-tuples, namely a and its complement, where in this case the complement of a 4-tuple a is defined as a+[2222] (modulo 4). Thus trellis 3 represents a total of $2^4 = 16$ 8-tuples.

Figure 18:
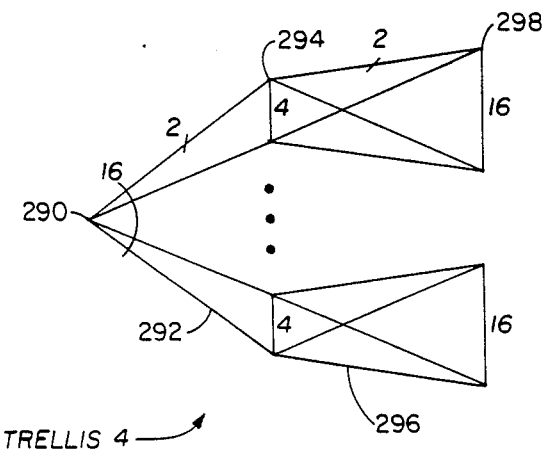
Figure 19:
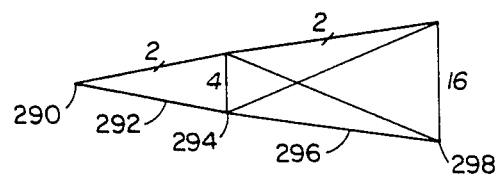

The set of all $2^{12}$ branches b+e generated by $G_b$ and A may be represented then by the schematic trellis diagram (trellis 4) shown in FIG. 18. Trellis 4 may be regarded as 256 parallel subtrellises of the form of trellis 3, each corresponding to a base branch b generated by $G_b$, with the initial nodes 290 of all subtrellises tied together, and furthermore with the subtrellises that share common intermediate states 294 combined. This occurs because b may be regarded as a sum b=c+d (modulo 4), where $$G_c = \begin{bmatrix} 1111 & 0000 \\ 1100 & 1100 \\ 1010 & 1010 \\ 2000 & 0000 \end{bmatrix}$$

$$G_d = \begin{bmatrix} 0000 & 1111 \\ 0000 & 2200 \\ 0000 & 2020 \\ 0000 & 2000 \end{bmatrix}$$

so that the 16 8-tuples generated by $G_d$ all have a first 4-tuple equal to [0000]. Thus it is better to regard trellis 4 as 16 subtrellises of the form of trellis 5 shown in FIG. 19, each corresponding to one of the 16 8-tuples generated by A. In FIG. 19, the "2" reminds us that each branch represents a 4-tuple and its complement. From an initial node 290, four branches 292 corresponding to 4-tuples a go to four intermediate nodes 294. From each intermediate node 294, 16 branches 296 corresponding to 4-tuples a+d go to each of the 16 final nodes 298, where d takes on the 16 values generated by $G_d$. At each final node 298, there is a merger of four paths, of which the best is selected to represent the base branch b+c+d, where c identifies which of the 16 subtrellises we are considering, and d identifies the final node 298 in that subtrellis.

As in the case of the Golay code, the metrics are computed iteratively from 1-tuples to 2-tuples, 4-tuples and finally 8-tuples, according to the following procedure (referring again to FIGS. 15, 16):

(a) For each of the 24 received values $r_i$, $1 \leq r_i \leq 24$, determine the normalized metrics m(0), m(1), m(2), and m(3) as indicated earlier (95, FIG. 16).

Figure 15:
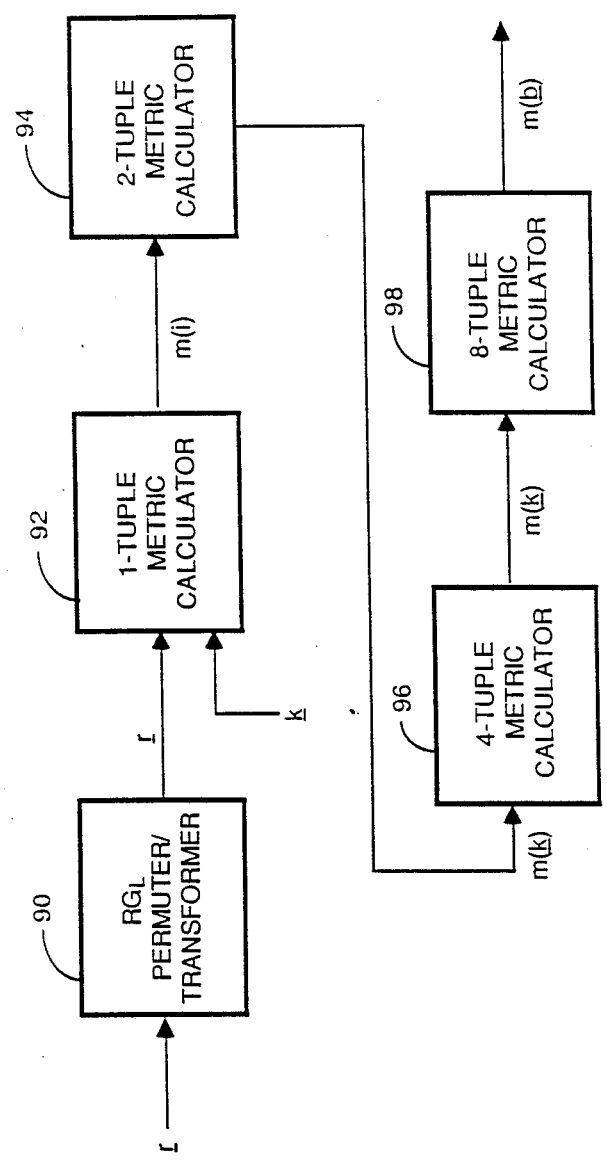
FIG. 15 is a block diagram of a portion of the soft decision decoder of FIG. 14.

(b) For each of the 12 2-tuples of received values ($r_1$, $r_2$), for each of the $4^2 = 16$ possible pairs k=($k_1$, $k_2$) of integers (modulo 4), compute (using a 2-tuple metric calculator 94) the normalized metric m(k)=m($k_1$)+m($k_2$) (97, FIG. 15).

(c) For each of the six 4-tuples of received values, represented as pairs ($r_1$, $r_2$) of 2-tuples, for each of the 128 possible pairs k=($k_1$, $k_2$) of integer 2-tuples (modulo 4) (not 256, because there must be an even number of odd integers), compute (using a 4-tuple metric calculator 96) the normalized metric m(k)=m($k_1$)+m($k_2$) [99, FIG. 16]. For every integer 4-tuple and its complement (defined as the integer 4-tuple plus [2222] (modulo 4)), determine and note in storage which one is better, and save the resulting 64 normalized branch metrics m(k) as 4-tuple metrics.

(d) For each of the three 8-tuples of received values, represented as pairs ($r_1$, $r_2$) of 4-tuples, for each of the 256 base branches b=($k_1$, $k_2$) generated by $G_b$, compute (using an 8-tuple metric calculator 98) the 4 normalized metrics m(b+e)=m($k_1$+e)+m($k_2$+e) for e equal to each of the 4 binary linear combinations of [2200] and [2020], find and note the best one, and store its metric as the normalized branch metric m(b) for the branch represented by b (101, FIG. 16).

This procedure can be executed on a general purpose microprocessor. Given the received values $r_i$, $1 \leq i \leq 24$, the total number of computations required to compute branch metrics is (a) negligible computation required;
(b) $12 \times 16 = 192$ additions of two metrics;
(c) $6 \times 128 = 768$ additions of two metrics, plus $6 \times 64 = 384$ 2-way comparisons;
(d) $3 \times 256 \times 4 = 3072$ additions of two metrics, plus $3 \times 256 = 768$ 4-way comparisons, equivalent to $3 \times 768 = 2304$ 2-way comparisons.

In total, therefore, the procedure requires 4032 additions of two metrics and 2688 equivalent 2-way comparisons, or a total of 6720 arithmetic operations.

The number of computations can be modestly reduced by starting with four normalized metrics equal to $2e_i$, $-2e'_i$, $-2e_i$, and $2e_i'$, rather than $3e_i$, $-e'_i$, $-e_i$, and $3e_i'$. In other words, subtract $e_i$ from two metrics (which correspond to complements) and $e'_i$ from the other two (also the metrics of complements). Use these metrics in steps (a), (b), and (c) above. Then (1) only half the number of additions need be performed, since the metric of a tuple and its complement are negatives of one another;
(2) the 2-way comparisons at the end of step (c) can be replaced by a sign test and taking of absolute values, since the comparisons are always between an integer 4-tuple and its complement.

However, after step (c), adjustments to the resulting 64 normalized branch metrics must then be made to make non-complement metrics comparable; further, step (d), which is the most complex step, cannot be substantially simplified by this technique.

Given the normalized branch metrics for all $3 \times 256 = 768$ branches that appear in trellis $2_L$, the final step is to find the best path through the trellis. This can be done very similarly to the Golay code decoding by the following procedure:

(a) for each of the 256 states 268 at the end of the second section:
(i) For each of the 16 paths that merge at that state, sum the corresponding normalized branch metrics (for branches 262, 266) to obtain a normalized path metric;
(ii) Make a 16-way comparison to find the least of these 16 normalized path metrics, and store that path and its metric as the survivors for that state;
(iii) Add the normalized branch metric for the branch from that state to the final node to the survivor metric to get the total path metric for the best path through that state.

(b) Make a 256-way comparison to find the least of these total path metrics, and store that path as the final winner, corresponding to the decoded Leech lattice point.

The total number of arithmetic operations for this procedure is:
a(i) 256×16=4096 additions of two metrics;
a(ii) 256 16-way comparisons (equivalent to 256×15=3840 2-way comparisons);
a(iii) 256 additions of two metrics;
(b) one 256-way comparison (equivalent to 255 2-way comparisons).

In summary, the procedure requires 4352 additions of two metrics and 4095 equivalent 2-way comparisons to find the best path through the trellis, given the normalized branch metrics, or a total of 8447 arithmetic operations. Combining this with the 6720 operations required to find the normalized branch metrics, the complete decoding requires a total of 15,167 arithmetic operations.

The exhaustive comparison method used in the Longstaff and Lang patent application requires of the order of 8192×24=196,608 arithmetic operations to identify the closest Leech lattice point. The Conway and Sloane method requires 55,968 "steps". The trellis decoding method described here is thus substantially less complex than the best prior methods known.

A high-speed QAM Leech lattice modem that sends of the order of 2400 2-dimensional signals per second could send 200 Leech lattice 24-tuples per second, so its decoder would need to perform of the order of 3 million arithmetic operations per second according to the procedure described above. This is within the capabilities of currently commercially available general-purpose microprocessors, such as the 68000 family, available from Motorola, Inc. Alternatively, special purpose circuitry similar to the branch metric computer and parallel subtrellis decoder shown earlier for Golay code decoding could be used for faster Leech lattice decoding.

Thus in decoding the Golay code or Leech lattice, we first compute branch metrics for every branch that appears in each of the three 8-tuple sections of the trellis, remembering both the identity and the metric of each of the 64 or 256 survivors. Then combine the first two sections into a "supersection" consisting of the first 16 symbols, and again determine 64 or 256 survivors by adding the metrics of two branches (representing two section survivors) and picking the best as the survivor for each state. Finally, combine this supersection with the final section to obtain a final "supersection" consisting of the entire 24 symbols; the winner of the resulting comparison is the final decoder output.

Other Decoding Procedures

A still simpler trellis-based decoding procedure is described below that does not always produce the same output as the procedure above, but is guaranteed to produce the same output when the received value 24-tuple r is within distance d/2 of the closest lattice point, where d/2 is half the minimum distance d between lattice points. In other words, this algorithm does not perform maximum-likelihood decoding, but "bounded-distance" decoding. Because errors can be made in the channel coding application only when the received value 24-tuple r is at distance d/2 or more from the transmitted lattice point in either case, the asymptotic performance of maximum likelihood decoding and bounded distance decoding is the same, although the "error coefficient" for bounded distance decoding is somewhat (a factor of approximately 1.5) higher.

To develop this procedure for the Leech lattice, note first that, since all points are either even or odd, the Leech lattice can be regarded as being made up of two "half-lattices", comprising the even and odd points, respectively. More formally, a 24-tuple k=a +2b+4c is in the "even Leech half-lattice" HL if and only if:
(a) a is all zero;
(b) b is a codeword in the Golay code;
(c) c is a codeword in the single-parity-check (24, 23) code, i.e., it has an even number of "1"s.

The "odd Leech half-lattice" $HL^c$ comprises all 24-tuples of the form k+(q, q, q), where k is any point in HL and q is the 8-tuple [5111 1111]. The whole Leech lattice is the union of HL with $HL^c$.

Now consider the lattice DHL, whose definition is the same as that for HL, except that we ignore the "parity-check" constraint on the fours-coordinates. That is, a 24-tuple k=a+2b+4c+ . . . is in the lattice DHL if and only if:
(a) a is all-zero;
(b) b is a codeword in the Golay code.

Thus DHL contains all the points in HL, plus all the points in the lattice coset HL' whose definition is the same as that for HL, except that the number of fours-coordinate "1"s is constrained to be odd rather than even. (Thus HL' comprises all 24-tuples of the form k+h, where k is any point in HL and h is a fixed 24-tuple with an odd number of "0"s and an odd number of "4"s—for example h=(g', g', g'), where g' is the 8-tuple [4000 0000].)

Similarly, we can define the lattice coset $DHL^c$ as the set of all 24-tuples k (q, q, q), where k is any point in DHL and q=[5111 1111]. Then $DHL^c$ contains all the points in the odd Leech half-lattice $HL^c$, plus all the points in the lattice $HL^{c'}$, whose definition is the same as that for $HL^c$, except that the number of fours-coordinate "1" is constrained to be even rather than odd. (Thus $HL^{c'}$ comprises all 24-tuples of the form k+1, where k is any point in HL and 1 is the all-ones vector.)

The general form of the decoding procedure then is as follows. Given a received value 24-tuple r:
(1) Find the closest point $x_e$ in DHL to r.
(2) Check whether $x_e$ is in HL or HL' (i.e., determine whether the number of fours-coordinate "1"s in $x_e$ is even or odd). If $x_e$ is in HL, accept it. If $x_e$ is not in HL, then change one coordinate in $x_e$ by ±4 in the way that will increase by the smallest amount the distance of the decoded 24-tuple $x_e$ from r, thus obtaining a modified 24-tuple $x_e$ that will now be in HL.
(3) Find the closest point $x_o$ in $DHL^c$ to r.
(4) Check whether $x_o$ is in $HL^c$ or $HL^{c'}$ by determining the parity of its fours-coordinate 24-tuple. If $x_o$ is in $HL^c$ (fours-coordinate parity is odd), accept it. If $x_o$ is in $HL^{c'}$, then change one coordinate in $x_o$ by ±4 in the way that will increase by the smallest amount the distance of the modified decoded 24-tuple $x_o$ from r.
(5) Compare whether $x_e$ or $x_o$ is closer to r; the final decoded 24-tuple x is the one that is closer.

Figure 20:
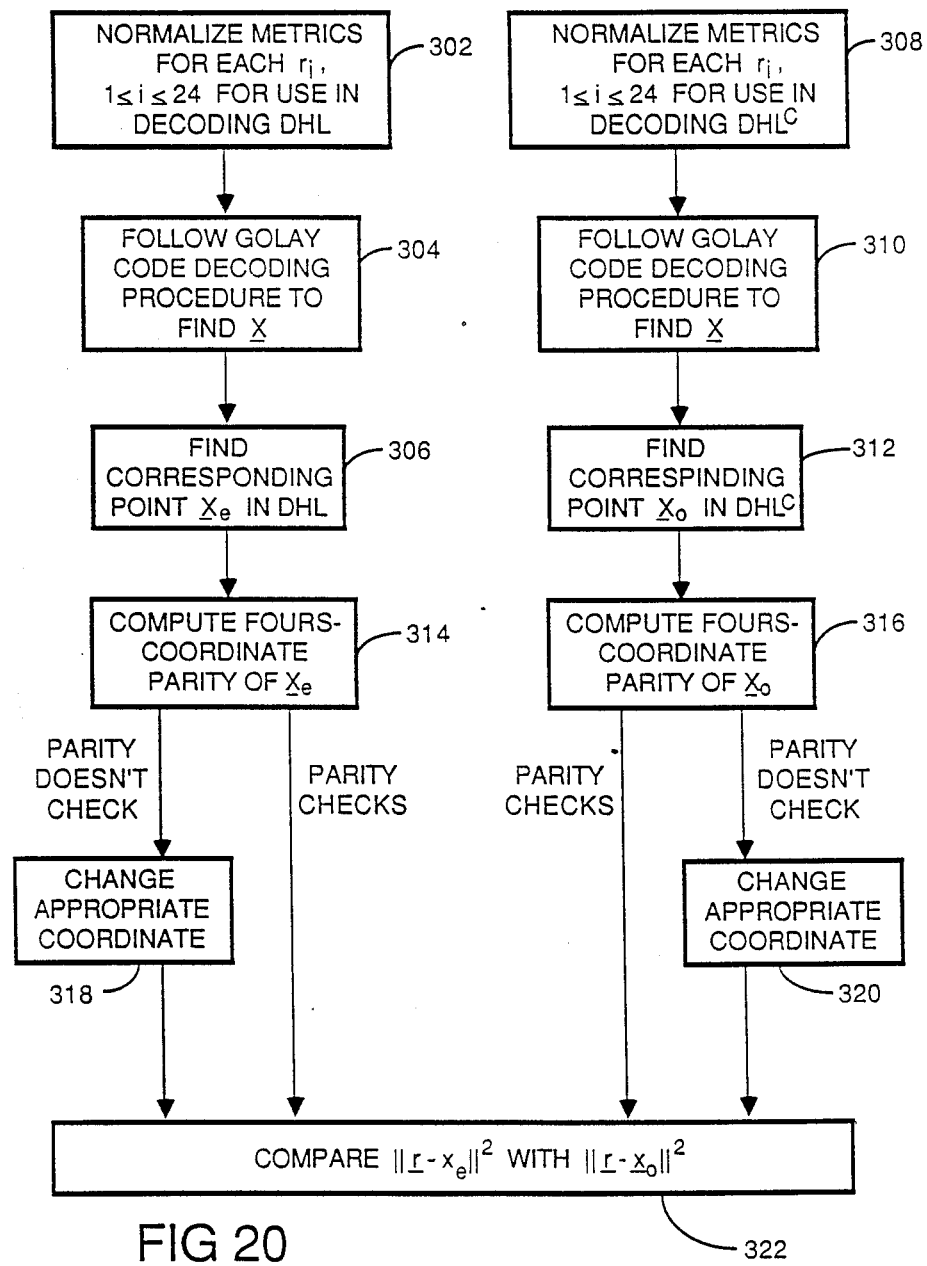
FIG. 20 is a flow chart of an alternative decoding technique.
Figure 21:
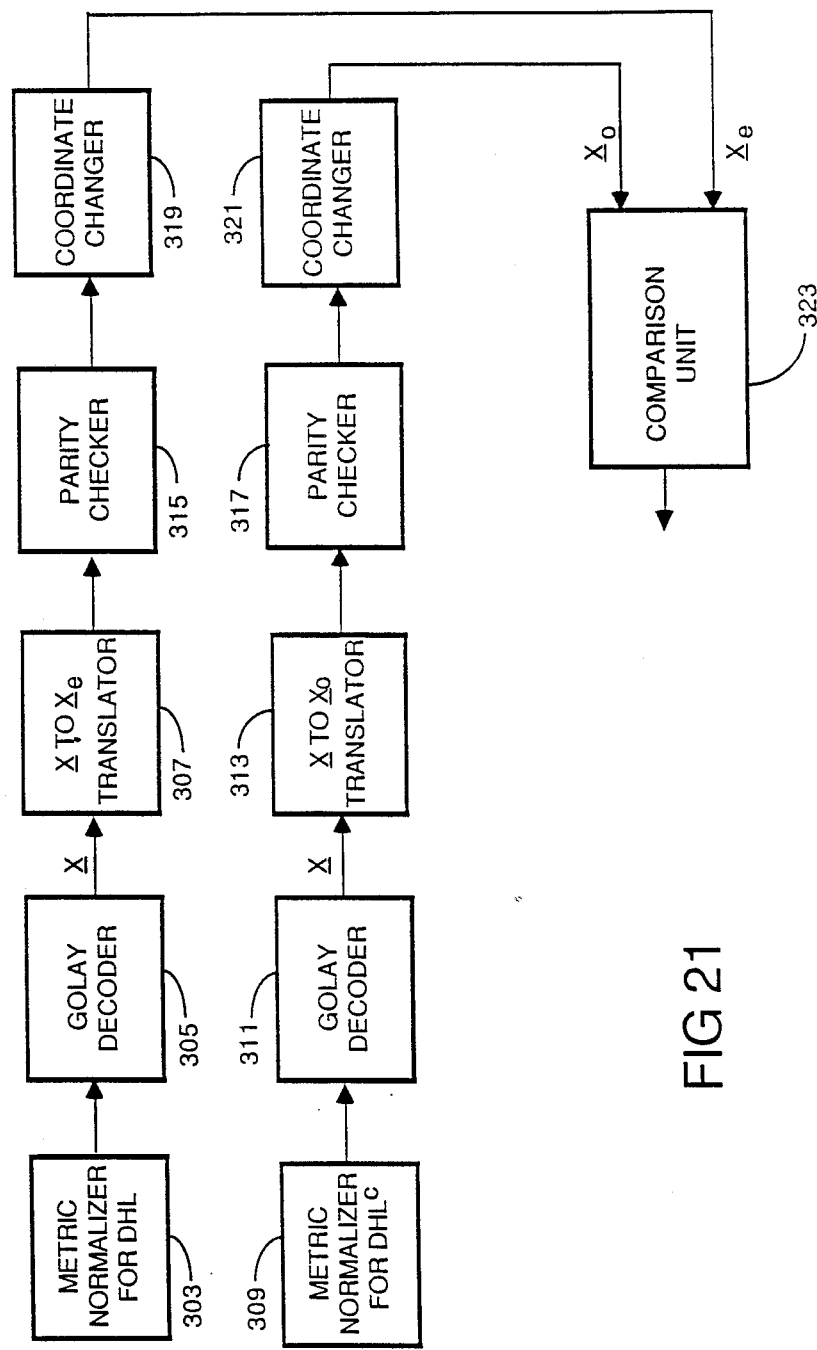
FIG. 21 is a block diagram of apparatus for performing the decoding of FIG. 20.

The lattices DHL and $DHL^c$ can be decoded by the procedure presented earlier for decoding the Golay code. Referring to FIGS. 20, 21 it is only necessary to normalize the metrics as follows:
(a) To decode DHL, for each of the 24 received values $r_i$, 1≦i24, let $k_{ei}$ be the closest even integer to $r_i$, let $e_i = |r_i - k_{ei}|$, and let $p_i=0$ if $k_{ei}=0$ (modulo 4) and $p_i = 1$ if $k_{ei} = 2$ (modulo 4); then let the normalized metrics $m(1) = (-1)^{p_i} e_i$ and $m(0) = -m(1)$ [302, FIG. 20] using a metric normalizer 303 (FIG. 21). Also, let $k_{0i}$ be the closest integer congruent to 0 (modulo 4) to $r_i$, and let $k_{2i}$ be the closest integer congruent to 2 (modulo 4) to $r_i$; $k_{ei}$ is one of these two. The rest of the decoding procedure is the same as for the Golay code [304, FIG. 19], using these normalized metrics in a Golay soft decision decoder 305. When the decoded Golay code 24-tuple x is determined, the corresponding point $x_e$ in DHL [306, FIG. 19] is the point which has coordinate $x_{ei}$ equal to $k_{0i}$ where $x_i = +1$ ("0"), and coordinate $k_{2i}$ where $x_i = -1$ ("1") using an x to $x_e$ translator 307.

(b) To decode DHL$^c$, for each received value $r_i$, let $k_{1i}$ be the closest integer congruent to 1 (modulo 4) to $r_i$, $k_{3i}$ be the closest integer congruent to 3 (modulo 4) to $r_i$, $k_{0i}$ be the closest odd integer to $r_i$, $e_i = |r_i - k_{0i}|$, and let $p_i = 0$ if $k_{0i} = 1$ mod 4 and $p_i = 1$ if $k_{0i} = 3$ mod 4; then let the normalized metrics $m(1) = (-1)^{p_i} e_i$ and $m(0) = -m(1)$ [308, FIG. 19] using a metric normalizer 309. Determine a decoded Golay code 24-tuple x using these normalized metrics [310] in a Golay soft decision decoder 311. The corresponding point $x_o$ DHL$^c$ is the point which has $x_{oi}$ equal to $k_{1i}$ where $x_i = +1$ ("0") and $k_{3i}$ where $x_i = -1$ ("1") [312], using an x to $x_o$ translator 313.

This accomplishes steps (1) and (3) of the general procedure. Steps (2) and (4) are each low-complexity operations that can be accomplished as follows:

(a) Compute fours-coordinate parity (of $x_e$ or $x_o$, respectively) [314, 316] using parity checkers 315, 317.

(b) If parity checks, stop.

(c) If parity does not check [318, 320]:

(i) determine the coordinate for which the magnitude of the error $e_i = r_i - x_{ei}$ or $r_i - x_{oi}$ is greatest;

(ii) change that coordinate by $+4$ if $e_i$ is positive, or $-4$ if $e_i$ is negative using coordinate changers 319, 321.

Step (5) is also a low-complexity operation involving comparisons of $\|r - x_e\|^2$ with $\|r - x_o\|^2$ [322] a comparison unit 323. Note that $\|r - x_e\|^2 - \|r - x_o\|^2 = (x_o - x_e, (r - x_o) + (r - x_e))$, where the second expression is an inner product involving the small integers $(x_{oi} - x_{ei})$ and the error terms $(r_i - x_{oi})$ and $(r_i - x_{ei})$ already computed in steps (2) and (4) (if not before), so that this comparison may be simply computed without multiplications (multiplication by a small integer can be replaced by a few additions) using previously determined metric or error quantities. The total computation for steps (2), (4) and (5) is thus of the order of a small multiple of 24 arithmetic operations.

The dominant contribution to decoding complexity is thus the Golay decoding procedure used in steps (1) and (3). Doing this twice according to the procedure presented earlier requires a total of $2 \times 1351 = 2702$ arithmetic operations. The whole "bounded-distance" Leech lattice decoding procedure thus requires fewer than one-fifth the 15,167 arithmetic operations required by the maximum-likelihood procedure. (Alternatively, other known Golay "soft decision" decoding procedures can be used.)

We now prove that the procedure is a bounded-distance procedure, as claimed, and determine the increase in "error coefficient".

The minimum squared distance between points in a lattice is the minimum squared length of any of its nonzero vectors. In the Leech lattice as originally defined, the minimum squared length is 32. The total number of minimum-length 24-tuples is 196,560, consisting of the following types:

(a) 98304 odd 24-tuples consisting of one coordinate of magnitude 3 and 23 coordinates of magnitude 1;

(b) 97152 even 24-tuples consisting of 8 coordinates of magnitude 2 and 16 coordinates equal to 0;

(c) 1104 even 24-tuples consisting of 2 coordinates of magnitude 4 and 22 coordinates equal to 0.

In the lattice DHL, the minimum squared distance is only 16, since this lattice contains the 48 24-tuples consisting of one coordinate of magnitude 4 and 23 coordinates equal to zero. However, these are the only nonzero 24-tuples of squared length 16. The next lowest length 24-tuples have squared length 32, and there are a total of 195,408 of these, consisting of the following types:

(a) 194,304 24-tuples consisting of 8 coordinates of magnitude 2 and 16 coordinates equal to 0;

(b) 1104 24-tuples consisting of 2 coordinates of magnitude 4 and 22 coordinates equal to 0.

Half of the first type are in the even Leech half-lattice HL, and all of the second type.

Let us now suppose that the received value 24-tuple r is within squared distance 8 of some Leech lattice point. Without loss of generality, we may take this point to be the all-zero 24-tuple 0, so our supposition is that $\|r\|^2 < 8$, or $\|r\| < 2\sqrt{2}$. Because the minimum distance between Leech lattice points is $d = \sqrt{32} = 4\sqrt{2}$ in 24-space, it necessarily follows that 0 is the closest Leech lattice point, all other points being at distance at least $4\sqrt{2} - \|r\|$.

The "bounded-distance" procedure finds the closest point in the lattice DHL to r. By the same argument as above, this cannot be any of the points in DHL of squared length 32, if $\|r\|^2 < 8$. It could be one of the points in DHL of squared length 16, i.e., a 24-tuple with a single coordinate of magnitude 4, and the rest zero. In this case fours-coefficient parity will not check, and the procedure requires making a change of $\pm 4$ in one coordinate so as to minimize the distance between the modified 24-tuple and r. So 0 will be one possible candidate for the modified vector; further, it must be the best one, since all other candidates are Leech lattice points, and 0 is the closest point to r in the Leech lattice. Therefore the procedure must decode into $x_e = 0$ at the end of Step 2. Furthermore, in the comparison of Step 5, 0 must again be the winner because it is there compared to $x_o$, which is again a Leech lattice point and thus must be further from r than 0. Thus we have proved:

Theorem: If r is within squared distance 8 of a Leech lattice point x, the bounded-distance procedure decodes into x.

When Leech lattice points are used for channel coding over a channel with white gaussian noise, at high signal-to-noise ratios the probability of decoding incorrectly is well approximated by an expression of the form $$PR(E) \approx N_d Q(d^2)$$

where $Q(d^2)$ is a function that for a given signal-to-noise ratio depends on the minimum squared length $d^2/4 = \|r - x\|^2$ of an error 24-tuple, and $N_d$ is the number of error 24-tuples of this squared length that can be decoded incorrectly, or the "error coefficient". In maximum likelihood decoding, $N_d$ is equal to the number of minimum-length vectors in the lattice, so $N_d = 196,560$ for the Leech lattice. For our bounded-distance algorithm, the error coefficient is $N'_d = 293,712$, corresponding to the number $N_d$, plus an additional 97,152 potential error-causing error 24-tuples of squared length 8, corresponding to the additional 97,152 24-tuples of squared length 32 in DHL that are not in the Leech lattice (if r is decoded into any of these, then the parity check will fail, but changing a single coordinate by ±4 cannot result in 0, even if 0 is in fact the closest Leech lattice point to r.) Thus the error coefficient is larger, but only by a factor of about 1.5, which will cost only a few tenths of a dB or less on gaussian channels.

This bounded-distance procedure can be generalized to other lattices that are defined in part by a parity-check constraint like that on Leech lattice fours-coefficient 24-tuples or any lattices that are equivalent to such lattices. Two examples of such lattices are:

(1) The 32-dimensional integer lattice whose points are defined by:
  (a) A ones-coefficient 32-tuple a that is either 0 or 1;
  (b) A twos-coefficient 32-tuple b that is a word from the (32, 16) Reed-Muller code, which has minimum Hamming distance 8;
  (c) A fours-coefficient 32-tuple c that has an even number of ones.

In this case the procedure is almost identical to that for the Leech lattice, in that even and odd 32-tuples are decoded separately, the former by decoding a lattice DHL defined as the even-integer lattice whose twos-coefficient 32-tuples are words from the (32, 16) code, and the latter by the corresponding odd-integer lattice, the decoded words in each case being checked for membership in the original lattice and modified by ±4 if necessary, and then the even and odd decoded 32-tuples being compared to find the final winner. The original lattice has a 256-state trellis, while DHL has a 64-state trellis. In this case bounded distance decoding increases the error coefficient only by a factor of 1.54, from 146,880 to 226,240.

(2) The 16-dimensional Barnes-Wall lattice points are defined by:
  (a) A ones-coefficient 32-tuple a that is a word from the (16, 5) Reed-Muller code, whose minimum Hamming distance is 8;
  (b) A twos-coefficient 32-tuple b that has an even number of ones.

In this case there is no need to consider odd and even 16-tuples separately; the bounded distance procedure is performed by decoding the lattice DHL whose points are defined by condition (a) alone, then checking twos-coefficient parity and modifying by ±2 if necessary to find a point in the Barnes-Wall lattice. The Barnes-Wall and (16, 5) lattices have 16-state and 8-state trellis diagrams, respectively. In this case bounded distance decoding increases the error coefficient by nearly a factor of 2, from 4320 to 8160.

For simpler lattices that have this representation (such as $D_4$, $E_8$, $D_8$ and indeed $D_N$ for any N), the bounded-distance method becomes equivalent to maximum likelihood decoding and to known procedures (see the 1982 Conway and Sloane article).

While these bounded-distance decoding procedures are only slightly suboptimum for the channel coding application, they may be more seriously suboptimum for quantizing applications.

The Leech half-lattice is an example of a class of lattices that we shall call "lattices based on binary codes." A lattice will be said to be based on binary codes if it is equivalent to an integer lattice that is defined as the lattice of all integer N-tuples such that the ones-coefficient N-tuple is a codeword in a first binary $(N, K_1)$ code, the twos-coefficient N-tuple is a codeword in a second binary $(N, K_2)$ code, and so forth. In shorthand, such an integer lattice is denoted by $L = (N, K_1) + 2(N, K_2) + \ldots + 2^{n-1}(N, K_n) + 2^n Z_N$. For example, the Leech half-lattice is equivalent to the lattice of all integer 24-tuples such that the ones-coefficient 24-tuple is in the (24, 12) Golay code and the twos-coefficient 24-tuple is in the (24, 23) single-parity-check code; i.e., the Leech half-lattice is denoted by $(24, 12) + 2(24, 23) + 4Z^{24}$. (The Leech lattice itself is not expressible in this way.)

Conway and Sloane (1986) have shown that when a lattice is based on a single binary code, there is a maximum-likelihood decoding procedure for the lattice that uses a maximum-likelihood decoding procedure for the binary code. This observation yields maximum likelihood decoding procedures for simple lattices like the $D_N$ lattices or the $E_8$ lattice.

When a lattice is based on two or more binary codes, the situation is different. The suboptimum "bounded-distance" decoding procedure given above is, as noted, not maximum likelihood—i.e., it does not always decode r into the nearest lattice point—but it is "bounded-distance"—i.e., it does decode r into the closest lattice point provided that r is within a distance equal to the guaranteed correctable radius of the lattice. Furthermore, it does this in two steps (for each Leech half-lattice), one step utilizing a maximum likelihood decoding procedure for the (24, 12) Golay code (or, more generally, any soft-decision decoding procedure for the Golay code), and the second step utilizing a maximum likelihood decoding procedure for the (24, 23) code. (See, for example, Wolf or Conway and Sloane (1986).)

We have discovered that whenever a lattice is based on two or more binary codes, it may be decoded in a series of steps, each step utilizing a binary code soft decision decoding procedure. Furthermore, whenever the binary code decoding procedures are maximum likelihood (or bounded distance), then the resulting lattice decoding procedure has the bounded distance property—i.e., it is guaranteed to decode r into the closest lattice point provided that the distance between r and the closest lattice point is less than half the minimum distance between lattice points.

To decode r into a point in the lattice $L = (N, K_1) + 2(N, K_2) + \ldots + 2^{n-1}(N, K_n) + 2^n Z^N$, the procedure (referring to FIGS. 23, 24) is as follows:

1. Map r 502 into the N-dimensional hypercube $[-1, 1]^N$ by the transformation $r_i' = 1 - 2|r_i - k_i|, 1 \leq i \leq N$, where $k_i$ is the closest even integer to $r_i$, using r to $r_i'$ transformer 503 (n=1). Decode r' (504) by a soft-decision decoding procedure for the $(N, K_1)$ binary code using decoder 505 (preferably maximum likelihood, but alternatively any good soft-decision decoding procedure). Let the decoded codeword $x_1$ be expressed (506) as an N-tuple of 0's and 1's (rather than + +1s and −1s, as is conventional for soft-decision decoding). Replace (508) r by $(r - x_1)/2$.

2. Repeat step 1, using a soft-decision decoding procedure for the $(N, K_2)$ code, obtaining a codeword $x_2$.

3, ..., n. Repeat step 1 for all n binary codes on which the lattice is based.

n+1. Decode (510) the current r using a decoder 507 into the integer N-tuple $x_{n+1}$, where $n_{30\ 1,\ 1}$ is the closest integer to $r_i$. The decoded lattice point is then generated (512) as $x_i + 2x_2 + \ldots + 2^{n-1}x_n + 2^n X_{n+1}$, using a generator 509.

Theorem: If a maximum likelihood decoding procedure is used in each step of the above procedure and if r is within distance d/2 of a lattice point, then the procedure decodes to r.

Proof: Without loss of generality, we may suppose that the lattice point to which r is nearest is 0; then the hypothesis is that $\|r\| < d/2$. Then in step (1) of the algorithm, $\|r'-1\|^2 = 4\|r-k\|^2 \leq 4\|r\|^2 < d^2$. If the minimum Hamming distance of the (N, K$_1$) code is d$_1$, then there are points in the lattice of squared length d$_1$, so $d^2 \leq d_1$. Hence $\|r'-1\|^2 < d_1$, which implies that r' is closer to 1 (representing $x_1 = 0$) than to any other vertex of the hypercube representing another binary codeword. Thus if the binary soft-decision decoding procedure is maximum likelihood (or even bounded-distance, meaning guaranteed to decode into the closest codeword vertex if the squared distance from r' to that vertex is less than d$_1$), then $x_1 = 0$. By induction and by extension of the above argument, $x_2, x_3, \ldots$, and $x_n$ and $x_{n+1}$ are all equal to 0, QED.

(To see that the assumption that the lattice point is 0 makes no difference, assume instead that the lattice point is $x_1 + \ldots$, where $x_1$ is an (N, K$_1$) codeword with coordinates (0, 1). Let $x_1'$ be the corresponding N-tuple with coordinates $(-1, 1)$; i.e., $x_{1i} = 1 - 2x_{1i}$. Then $r_i' - x_{1i}' = 2|r_i - k_i(x_i)|$, where $k_i(x_i)$ is the nearest even integer $k_i$ to $r_i$ if $x_i = 0$, and the nearest odd integer $k_i$ to $r_i$ if $x_i = 1$, because $|r_i - k_i'| = 1 - |r_i - k_i|$. The proof therefore carries through as stated if $x_1'$ is substituted for 1.)

In the case of a lattice that is based on two binary codes, the second code being an (N, N−1) code, the above procedure reduces to the form of steps (i) and (ii) of the suboptimum Leech lattice decoding procedure, which decodes one Leech half-lattice. It can be shown that for such lattices the error coefficient with this procedure is never increased by more than a factor of two over that for maximum likelihood decoding. For other lattices based on binary codes, however, the error coefficient can increase much more significantly.

All of the lattices discussed above can be defined in terms of a finite set of $2^K$ codewords, which are the binary linear combinations of K rows of a (nonbinary integer) generation matrix, modulo an integer P which is a power of two, i.e., $P = 2^b$ for some b. A codeword (N-tuple) is in the lattice if and only if it is congruent to one of these $2^K$ N-tuples, modulo P.

The dual lattice to such a lattice may be defined as the set of all integer N-tuples that are orthogonal to all these $2^K$ codewords, modulo P; i.e., whose inner product with any N-tuple in the original lattice is zero, modulo P. In this case, the dual lattice can be defined in terms of a finite set of $2^{bN-K}$ codewords, which are the binary linear combinations of (bN-K) rows of a (nonbinary integer) generator matrix, modulo P; the entire dual lattice is the set of all integer N-tuples that are congruent to one of these $2^{bN-K}$ N-tuples, modulo P.

With this characterization of lattices and dual lattices given here, one extension of the result of Wolf, cited above, would yield a trellis diagram for lattices with not more than M states, where M is the lesser of the number of codewords in the finite sets defined above for lattices and dual lattices; that is, $M = \min[2^K, 2^{bN-K}]$. For example, for the Leech lattice in its preferred representation given here, P=4, N=24, and K=24, so $M = \min[2^{24}, 2^{24}] = 2^{24}$. (In fact the Leech lattice is its own dual.) Note that in its conventional representation, P=8 and K=36, so that the conventional representation would yield $M = 2^{36}$.

Other Embodiments

Other embodiments are within the following claims.

In general, trellis decoding procedures like the ones described above for the Golay code and Leech lattice may be developed for any code or lattice for which similar regular, simple trellises may be constructed. These include the following cases:

1. Codes and lattices which comprise sequences of 3 n-tuples $(a_1 + b_1 + c, a_2 + b_1 + b_2 + c, a_3 + b_2 + c,)$ where
    (a) $a_1$, $a_2$, and $a_3$, are n-tuples generated by a generator matrix A (or more generally are taken from a set of n-tuples $S_A$);
    (b) $b_1$ and $b_2$ are n-tuples generated by a generator matrix B (or more generally are taken from a set of n-tuples $S_B$);
    (c) c is an n-tuple generated by a generator matrix C (or more generally is taken from a set of n-tuples $S_c$).

In any case there will be a trellis representation similar to trellis 2, where the trellis is composed of a number of subtrellises similar to trellis 1. Each such subtrellis will be associated with an n-tuple c from the set $S_c$, and represents all 3n-tuples that include (c, c, c). Each subtrellis will consist of a set of branches going from an initial node to a first set of intermediate states, each branch representing an n-tuple b, from $S_B$, so that each first intermediate state can be identified with a particular n-tuple $b_1$; from each first intermediate state, a set of branches will go to each of a second set of intermediate states, each such branch representing an n-tuple $b_1 + b_2$, where $b_1$ is the n-tuple associated with the first state and $b_2$ with the second state; from each such second state, a branch representing $b_2$ goes to the final node. Each branch represents all n-tuples of the form $a + b + c$, where c is determined by the subtrellis, b by the branch and a comprises all n-tuples in $S_A$.

As already mentioned, good codes and lattices are Obtained when the sets $S_c$, $S_{c \times B} = \{b + c: b \in S_B, c \in S_c\}$, and $S_{c \times B \times A} = \{a + b + c: a \in S_A, b \in S_B, c \in S_c\}$ are progressively larger sets with within-set distances in the ratio 4:2:1 or 6:3:2. In addition to the Golay code, good binary linear (3n, k, d) codes of this type are: (6, 3, 3), (12, 8, 3), (12, 4, 6), (24, 19, 3), (24, 5, 6), etc., where 3n is the code length, k is the number of information symbols, and d the minimum Hamming distance. The sets $S_A$, $S_B$, and $S_c$ need not represent linear codes or lattices, however, as long as their n-tuples can be added together. In fact, as previously mentioned, $a_1, a_2, a_3, b_1, b'_1(b_1), b_2, b'_2(b_2)$ and c, c' (c) c'' (c) can all come from different sets, and the trellis as just described will still represent the resulting code or lattice. (The notation $b_1'(b_1)$ means that $b_1'$ is determined by $b_1$ but is not necessarily the same as $b_1$). The n-tuples could even be of different lengths: i.e., $n_1$-tuples, $n_2$-tuples, and $n_3$-tuples, respectively.

2. Codes and lattices which comprise sequences of four n-tuples $(a_1 + b_1 + c, a_2 + b_1 + b_2 c, a_3 + b_2 + b_3 + c, a_1 + b_3 + c)$ where $a_1, a_2, a_3, a_4, b_1, b_2, b_3$, and c are defined as above. In this case the trellis will have four sections rather than three, and subtrellis, associated with $b_1, b_2$, and $b_3$, respectively, but otherwise the trellis will be as described above. Good codes and lattices of this type are obtained when the sets $S_c$, $S_{c \times B}$, and $S_{c \times B \times A}$ have within-set minimum distances in the ratio 4:2:1. All the binary Reed-Muller codes of lengths 4, 8, 16, . . . have such representations; so do the densest lattices known of dimension 4, 8, 16, and 32 (the 4 and 8-dimensional cases are briefly mentioned in the parent application while the 16 and 32 dimensional cases have been described above). The generalizations just mentioned in the 3-section case apply here as well.

Generalizations to more than 4 n-tuples also can be made.

Many good codes can also be obtained by shortening codes of the above type. For example, the (23, 12, 7) Golay code is obtained by dropping one coordinate from the length-24 Golay code described above. Such codes can be decoded by lengthening the shortened code appropriately—e.g., in this case, set $r_{24}$ to $+1$, representing "0"—and then using the decoding method for the longer code.

In general, efficient trellis decoding procedures consist of two stages: first, compute normalized branch metrics for all branches that occur in all sections; second, using these branch metrics, find the best path through the trellis, using the Viterbi algorithm or equivalent.

The branch metric computation is generally most efficiently handled by first computing 1-tuple metrics, then 2-tuples, then 4-tuples, etc., in an iterative fashion. These computations are efficiently organized by arranging them in accordance with trellis diagrams reflecting the set of all n-tuples represented by these branches. When mergers occur in these trellis diagrams, sub-n-tuples can be correspondingly discarded according to which metric is best at that point, thus reducing further calculation and storage.

The finding of the best path is preferably organized by finding the best paths through a set of subtrellises, and then comparing those to find the overall winner. The subtrellises may be those associated with each possible c, as described above. Or, in cases where a lattice consists of odd-integer points and even-integer points, it can be helpful to decode the two subtrellises representing these two sets separately.

Whenever possible, it is useful to normalize metrics so that the metric of an n-tuple and its "complement" are negatives of each other, as described above. This can cut in half the number of n-tuple metrics that have to be computed, and can reduce the determination of whether an n-tuple or its complement has a better metric to a sign test and taking of absolute values.

In the case of lattices or sublattices for which part of the definition is that a certain set of coordinate coefficients must have odd or even parity, it can be helpful to decode the lattice or sublattice as though this condition did not exist, and then to modify the decoded point if necessary by changing a single coordinate in such a way as to satisfy the parity condition, that coordinate being selected as the one where the decoded vector is most distant from the received value. While the result may not be guaranteed to be the same as full maximum likelihood decoding, computation may be significantly reduced without great loss in performance.

The parent application disclosed several smaller-dimensional lattices and showed how they could be expressed as simple trellises and subjected to Viterbi algorithm trellis decoding. In one embodiment disclosed in the parent application, 8-dimensional lattice points are used. A block of 16 information bits is sent in each of four QAM modulation intervals using the 2-dimensional constellation of FIG. 22, having 32 points.

The 32 signals are arranged in a rectangular grid with integer coordinates, each signal point having one odd and one even coordinate and are divided into four disjoint subsets ($A_0$, $A_1$, $B_0$, $B_1$) each having eight signals.

The four subsets $A_0$, $A_1$, $B_0$, $B_1$ are arranged in two groups (A, comprising subsets $A_0$ and $A_1$, and B, comprising $B_0$ and $B_1$) of two subsets each.

Each of the 32 constellation signals can be uniquely specified by a total of 5 bits: one bit naming the group from which it is taken, one bit naming the subset within that group, and three bits naming which of the eight signal points within the named subset is to be selected. The information needed to select each of the four signal points for each block is derived from the 16 input bits ($b_1$–$b_{16}$) as follows.

Bit $b_1$ (called the group bit) is used to determine the one group from which all four signal points for a given block is to be drawn. (The designation $group_1$ refers to the group from which the first signal point is selected; and so on.) $Group_1$ through $group_4$ are therefore always the same group for a given block. For example, if $b_1=0$ all four signal points would be selected from group A; if $b_1=1$, all would be from group B.

Bits $b_2$, $b_3$, and $b_4$ determine from which subsets of the selected group each of the four signal points is to be drawn. Bits $b_2$, $b_3$, and $b_4$ respectively determine $subset_1$, $subset_2$, and $subset_3$. For example, in a block for which the signal points are from group A, if $b_2=0$ the first signal point would be selected from subset $A_0$, otherwise (if $b_2=1$) from $A_1$. $Subset_4$ is a parity bit generated by subset selector 34 such that bits $b_1$, $b_2$, $b_3$ and the parity bit (called subset bits) include an even number of 1 bits. Thus the subset bits can be viewed as coded bits derived by a (4, 3) single-parity-check code from the input bits $b_2$–$b_4$. The remaining bits ($b_5$–$b_{16}$) taken three at a time (called signal point bits) specify which particular four signal points (signal $point_1$–signal $point_4$) are to be drawn from the selected 8-point subsets.

Although the signal selection (coding) has been explained as the selection of four successive signal points from a 2-dimensional signal constellation, it could also be viewed as an 8-space block coded modulation technique in which a set of $2^{16}$ codewords are arranged on a lattice in 8-space, and coding consists of selecting one of the codewords for each block. The eight coordinates of the selected codewords could then be taken two at a time to specify the four two-dimensional signal points to be used for carrier modulation. The lattice is equivalent to the 8-dimensional lattice called $E_8$.

Figure 23:
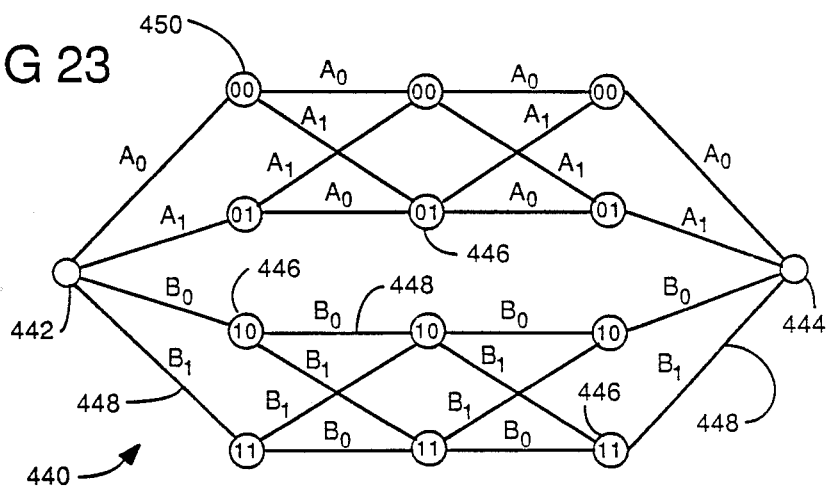

Referring to FIG. 23, for the eight dimensional lattice $E_8$ (disclosed with respect to FIG. 3 of the parent application), the lattice is described as a four section 4-state trellis 440. The trellis shows from left to right the state of the encoder at five successive times, beginning with a node 442 reflecting the time immediately before encoding of a new block begins and ending with a node 444 reflecting the time just after the encoding of that block has been completed. In between nodes 442, 444 are shown four modulation intervals separated by three time instants, each such instant being represented by a column of four nodes 446 corresponding to the four states which the encoder can occupy at that instant. (In this case each section corresponds to one 2-dimensional modulation interval.) Branches 448 from each node to the next nodes to its right correspond to modulation intervals and reflect transitions of the state of the encoder which can occur as a signal point is selected. Each branch 448 is labeled with a subscripted letter to indicate the subset corresponding to the signal point associated with that modulation interval. Each node 446 is marked with a two-bit value, the first bit reflecting the group bit for all signal points for that block (i.e., 0=A, 1=B), and the second bit reflecting the value of the accumulated parity check subset as of that time.

The encoder begins at a common node 442 (reflecting that the encoder's state does not depend on historical information, i.e., each 8-dimensional block is independent of all others). From node 442 the encoder branches to one of four states depending on the group and subset bits of the first selected signal point. For example, if the first selected signal point is from subset $A_0$, the next encoder state is at node 450. For the next two signal points, the encoder state stays in the half of the trellis defined by the group bit of the first signal point, but switches states (from one parity to the other) in accordance with the transitions shown. Only 16 of the 32 signals in the constellation are available for selection of the second and third signal. The transition to the final node 444 is determined by the parity state of the encoder (e.g., an $A_1$ or $B_1$ point is sent if the parity state is 1, otherwise an $A_0$ or $B_0$ point is sent). Only a subset of 8 of the 32 signals in the constellation are available for selection of the fourth signal point, and that subset depends on the first three selected signal points. Thus the paths through the trellis define the possible combinations of subsets from which the sequence of four signal points for each block can be chosen.

In decoding each received word, in accordance with the Viterbi algorithm, decisions are first made (using conventional slicing in two dimensions, with the coordinate axes rotated 45°) of which of the eight signals in each of the four subsets is closest to each received signal point. A branch in trellis 440 (corresponding to each subset) is then associated with the closest signal in its corresponding subset, and the so-called metric of each branch is the squared distance between the received signal point and the corresponding closest signal associated with that branch. The remaining steps of the Viterbi algorithm decoding proceed as described in Forney's Viterbi article, cited in the parent application. In brief, given the branch metrics for each section, the Viterbi algorithm proceeds from left to right, determining four survivors for a supersection consisting of the first two sections, then the four survivors for the supersection consisting of the first three sections, and then finally the winner for the entire block after four modulation intervals, at which time all trellis branches converge to a single node 444.

FIG. 13 of the parent application shows a 2-section trellis for a 4-space lattice ($D_4$).

Figure 22:
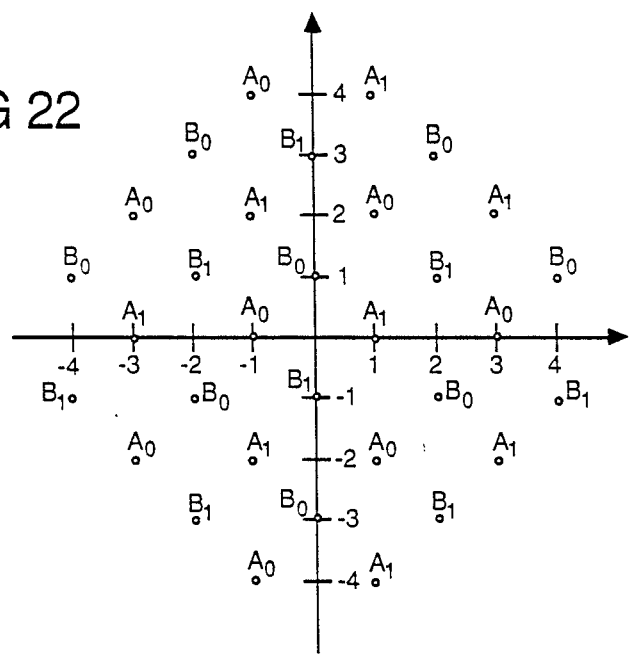
FIGS. 22 and 23 are a 2D constellation and a trellis diagram related to the $E_8$ lattice.

Trellises for extensions of the 4-space and 8-space systems disclosed in the parent application are illustrated in FIGS. 22 and 23 of the parent application. (The 4-space extensions give the lattices called $D_N$, for N equal to an even integer greater than 4.)

I claim:

1. A decoder for selecting a codeword near to a given N-tuple r, N an integer, said codeword representing a point in an N-dimensional lattice, said N-tuple r comprising a sequence of N real values $r_i$ representing signals, the values $r_i$ of said N-tuple r being organized into n sections $r_j$ respectively of lengths $N_j$, where j is an integer and $1 \leq j \leq n$, and where n is an integer and $n \geq 3$, and where $N_j < N$, said decoder comprising at least first and second decoding stages, said first decoding stage comprising substages associated respectively with said sections $r_j$, $1 \leq j \leq n$, each said substage of said first stage comprising means for evaluating distances between multiple sets of possible partial codewords and said section $r_j$, said partial codewords comprising the corresponding $N_j$ of said symbols appearing in a subset of said codewords, means for selecting as a survivor from each of said multiple sets one said partial codeword, said selection being based on said distances, and means for providing to said second decoding stage, information indicative of each of said multiple survivors and its distance, said second decoding stage comprising $n-1$ substages, each said substage of said second stage being arranged to operate said respect to a supersection made up of a combination of two parts, each said part being a said section or a said supersection combined in an earlier said substage of said second stage, a final said substage being arranged to operate with respect to a final said supersection whose parts make up the complete said N-tuple r, each said substage of said second stage except said final substage comprising means for evaluating distances between multiple sets of possible partial codewords and said received values in the corresponding said supersection, said evaluation being based on said information indicative of said survivor distances for said survivors corresponding to each of the two said parts, means for selecting as a survivor from each of said multiple sets one said partial codeword on the basis of said distances, and for providing information indicative of each of said multiple survivors and its distance to subsequent said decoding substages of said second stage, said final substage comprising means for evaluating distances between said codewords and said N-tuple r, said evaluation being based on said indications of said survivor distances for said survivors corresponding to each of two said parts, means for selecting one said codeword as a finally decoded codeword based on said distances between said codewords and said N-tuple r, and for providing information indicative of said finally decoded codeword as an output of said decoder.

2. A decoder for selecting multiple survivors from multiple sets of partial codewords near to a given $N_j$-tuple $r_j$, $N_j$ an integer, each said partial codeword comprising $N_j$ symbols appearing in a subset of said codewords, each said codeword representing a point in an N-dimensional lattice, said $N_j$-tuple $r_j$ comprising a sequence of $N_j < N$ real values representing signals, N an integer, the values $r_i$ of said $N_j$-tuple $r_j$ being organized into $n_j$ sections $r_k$ respectively of lengths $N_k$, where k is an integer and $1 < k < n_j$, and where $n_j$ is an integer and $n_j > 2$, and where $N_k < N_j$, said decoder comprising at least first and second decoding stages, said first decoding stage comprising a substage for each section $r_k$, $1 \leq k \leq n_j$, each said substage comprising means for evaluating distances between multiple sets of possible partial codewords and said section $r_k$, said partial codewords comprising the corresponding $N_k$ of said symbols appearing in a subset of said codewords, means for selecting as a survivor from each of said multiple sets one said partial codeword, said selection being based on said distances, and for providing information indicative of each of said multiple survivors and its distance to said second decoding stage, said second decoding stage comprising n−1 substages, each said subsage of said second stage being arranged to operate with respect to a supersection made up of a combination of two parts, each said part being a said section or a said supersection combined in an earlier said substage of siad second stage, a final said substage being arranged to operate with respect to a final said supersection corresponding to the complete said $N_j$-tuple $r_j$, each said substage comprising means for evaluating distances between multiple sets of possible partial codewords and said received values in the corresponding said supersection, said evaluation being based on said information indicative of said survivor distances for said survivors corresponding to each of the two said parts, means for selecting as a survivor from each of said multiple sets one said partial codeword on the basis of said distances, and for providing information indicative of each of said multiple survivors and its distance to subsequent said decoding substages of said second stage, or, if said substage is the final said substage, as a final output of said decoder.

3. A decoder for selecting a codeword near to a given N-tuple r, N an integer, said codeword being drawn from among the codewords of a code, said N-tuple r comprising a sequence of N real values $r_i$ representing signals, the values $r_i$ of said N-tuple r being organized into n sections $r_j$ respectively of lengths $N_j$, where j is an integer and $1 \leq j \leq n$, and where $n \geq 3$, and where $n_j < N$, said decoder comprising at least first and second decoding stages, said first decoding stage comprising substages associated respectively with said sections $r_j$, $1 \leq j \leq n$, each said substage of said first stage comprising means for evaluating distances between multiple sets of possible partial codewords and said section $r_j$, said partial codewords comprising the corresponding $N_j$ of said symbols appearing in a subset of said codewords, means for selecting as a survivor from each of said multiple sets one said partial codeword, said selection being based on said distances, and means for providing to said second decoding stage, information indicative of each of said multiple survivors and its distance, said second decoding stage comprising n−1 substages, each substage in said second stage corresponding to a supersection comprising at least two or more of said sections, each said substage of said second stage being arranged to operate with respect to a supersection made up of a combination of two parts, each said part being a said section or a said supersection combined in an earlier said substage of said second stage, a final said substage being arranged to operate with respect to a final said supersection whose parts make up the complete said N-tuple r, each said substage of said second stage except said final substage comprising means for evaluating distances between multiple sets of possible partial codewords and said received values in the corresponding said supersection, said evaluation being based on said information indicative of said survivor distances for said survivors corresponding to each of the two said parts, means for selecting as a survivor from each of said multiple sets one said partial codeword on the basis of said distances, and for providing information indicative of each of said multiple survivors and its distance to subsequent said decoding substages of said second stage, said final substage comprising means for evaluating distances between said codewords and said N-tuple r, said evaluation being based on said indications of said survivor distances for said survivors corresponding to each of two said parts, means for selecting one said codeword as a finally decoded codeword based on said distances between said codewords and said N-tuple r, and for providing information indicative of said finally decoded codeword as an output of said decoder, and wherein $N_j > 2$ for all j, $1 \leq j \leq n$.

4. A decoder for selecting multiple survivors from multiple sets of partial codewords near to a given $N_j$-tuple $r_j$, $N_j$ an integer, each said partial codeword comprising $N_j$ symbols appearing in a subset of said codewords, each said codeword being draw from among the codewords of a code, said $N_j$-tuple $r_j$ comprising a sequence of $N_j < N$ real values representing signals, the values $r_i$ of said $N_j$-tuple $r_j$ being organized into $n_j$ sections $r_K$ respectively of lengths $N_K$, where k is an integer and $1 \leq k \leq n_j$, and where $n_j$ is an integer and $n_j \geq 2$, and where $N_K < N_j$, said decoder comprising at least first and second decoding stages, said first decoding stage comprising a substage for each section $r_K$, $1 \leq k \leq n_j$, each said substage comprising means for evaluating distances between multiple sets of possible partial codewords and said section $r_K$, said partial codewords comprising the corresponding $N_k$ of said symbols appearing in a subset of said codewords, means for selecting as a survivor from each of said multiple sets one said partial codeword, said selection being based on said distances, and for providing information indicative of each of said multiple survivors and its distance to said second decoding stage, said second decoding stage comprising n−1 substages, each said substage of said second stage being arranged to operate with respect to a supersection made up of a combination of two parts, each said part being a said section or a said supersection combined in an earlier said substage of said second stage, a final said substage corresponding to a final said substage being arranged to operate with respect to a final said supersection corresponding to the complete said $N_j$-tuple $r_j$, each said substage comprising means for evaluating distances between multiple sets of possible partial codewords and said received values in the corresponding said supersection, said evaluation being based on said information indicative of said survivor distances for said survivors corresponding to each of the two said parts, means for selecting as a survivor from each of said multiple sets one said partial codeword on the basis of said distances, and for providing information indicative of each of said multiple survivors and its distance to subsequent said decoding substages of said second stage, or, if said substage is the final said substage, as a final output of said decoder.

5. The decoder of claim 1 or 3 wherein $N_j > 2$ for all j, $1 \leq j \leq n$.

6. The decoder of claim 5 wherein said lattice comprises all points congruent (molulo P) to a finite set of lattice points of size S, a dual lattice to said lattice comprises all points congruent (modulo P) to a finite set of dual lattice points of size T, and the number os said survivors from said multiple sets for every said stage is less than a number M equal to the lesser of S and T.

7. The decoder of claim 5 wherein said code comprises a set of S codewords, a dual code to said code comprises a set of dual codewords T, and the number of said survivors from said multiple sets for every said stage is less than a number M equal to the letter of S or T.

8. The decoder of claim 7 wherein said number of survivors is less than M in each said substage of said second stage.

9. The decoder of claim 7 wherein said code is a (24, 12, 8) Golay code, and $S = 2^{12}$, $T = 2^{12}$, and the number of said survivors is $2^6$.

10. The decoder of claim 5 wherein n is 3 and said second decoding stage comprises two said decoding substages including said final substage.

11. The decoder of claim 5 wherein n is 4 and said second decoding stage comprises three said substages including said final substage.

12. The decoder of claim 11 wherein $N_1 = N_2 = N_3$.

13. The decoder of claim 12 wherein $N_1 = N_2 = N_3 = 8$.

14. The decoder of claim 5 wherein $N = 24$.

15. The decoder of claim 5 wherein said code comprises a binary code.

16. The decoder of claim 15 wherein said code is a (24, 12, 8) Golay code.

17. The decoder of claim 5 wherein said second decoding stage selects said finally decoded codeword based on a Viterbi algorithm.

18. The decoder of claim 5 wherein said means for evaluating said distances generates normalized versions of said distances such that the relative distance rankings of said partial codewords are not affected, said normalized versions being generated without multiplications.

19. The decoder of claim 18 wherein said means for evaluating said distances generates said normalized versions such that the distance between the ith symbol $r_i$, of said N-tuple r can be obtained directly from $r_i$.

20. The decoder of claim 18 wherein said means for evaluating said distances generates said normalized versions such that the distance of each said partial codeword and its complement are the same except for their signs.

21. The decoder of claim 5 adapted for use in a communication system of the kind in which information to be sent over a band-limited channel is encoded into a succession of said codewords, and wherein said decoder comprises means for deciding which codeword was sent on the basis of a received set of values corresponding to said N-tuple r.

22. The decoder of claim 5 wherein said lattice is equivalent to a lattice of points whose coordinates are integers.

23. The decoder of claim 22 wherein said integer lattice is equivalent to a 24-dimensional Leech-type lattice.

24. The decoder of claim 23 wherein the maximum number of said survivors in any said substage is $2^8$.

25. The decoder of claim 23 wherein said decoder comprises means for applying, as stages in decoding said N-tuple r, binary decoding procedures applicable to a Golay code, said binary decoding procedures being applied twice, once to a Leech half-lattice, and the second time to a coset of said Leech half-lattice.

26. The decoder of claim 22 wherein said lattice is equivalent to an integer lattice based on binary codes, and said decoder comprises decoding means for applying, as stages in decoding said N-tuple r, binary decoding procedures applicable to said binary codes.

27. The decoder of claim 26 wherein said lattice is a Leech half-lattice, said binary codes include a Golay code, and the said binary decoding procedures include a decoding procedure for said Golay code.

28. The decoder of claim 5 wherein said selected codeword is the nearest codeword to said N-tuple r.

29. The decoder of claim 5 wherein said codewords are each a linear combination of rows of a matrix that can be expressed in the form:

$$G = \begin{bmatrix} A & O & O \\ O & A' & O \\ O & O & A'' \\ B & B' & O \\ O & B'' & B''' \\ C & C' & C'' \end{bmatrix}$$

and wherein each column of said matrix G corresponds to one said section.

30. The decoder of claim 29 wherein said lattice has points such that a predetermined set of coordinate coefficients for the symbols of said points has odd or even parity, said decoder further comprises means for decoding said N-tuple r without regard to said parity into a near possible codeword, and means for modifying one said selected near possible codeword by changing a single said symbol to satisfy said parity.

31. The decoder of claim 30 wherein said single symbol is selected as the one that is most distant from the corresponding coordinate of said N-tuple r.

32. The decoder of claim 29 wherein A generates a dense lattice, B and A together generate a dense lattice with smaller distance, and C, B, and A together generate a dense lattice with still smaller distance.

33. The decoder of claim 29 wherein A generates a code of large distance, B and A together generate a code with smaller distance, and C, B, and A together generate a code with still smaller distance.

34. The decoder of claim 5 wherein said codewords are each a linear combination of rows of a matrix that can be expressed in the form $$G = \begin{bmatrix} A & 0 & 0 & 0 \\ 0 & A & 0 & 0 \\ 0 & 0 & A & 0 \\ 0 & 0 & 0 & A \\ B & B & 0 & 0 \\ 0 & B & B & 0 \\ 0 & 0 & B & B \\ C & C & C & C \end{bmatrix}$$

35. The decoder of claim 34 wherein said sections correspond to columns of said matrix.

36. The decoder of claim 5 further comprising means for transforming each N-tuple r into a form that is generated by a predetermined form of matrix.

37. The decoder of claim 36 wherein said transformation is an inverse permutation.

38. The decoder of claim 36 wherein said transformation is a rotation in two-dimensional space.

39. The decoder of claim 1 or 2 wherein
said lattice comprises all points congruent (modulo P) to a finite set of lattice points of size S,
a dual lattice to said lattice comprises all points congruent (modulo P) to a finite set of dual lattice points of size T, and
the number of said survivors from said multiple sets for every said stage is less than a number M equal to the lesser of S and T.

40. The decoder of claim 3 or 4 wherein
said code comprises a set of S codewords,
a dual code to said code comprises a set of dual codewords T, and
the number of said survivors from said multiple sets for every said stage is less than a number M equal to the lesser of S or T.

41. The decoder of claim 40 wherein said number of survivors is less than M in each said substage of said second stage.

42. The decoder of claim 40 wherein said code is a (24, 12, 8) Golay code, and $S=2^{12}$, $T=2^{12}$, and the number of said survivors is $2^6$.

43. The decoder of claim 1 or 3 wherein n is 3 and said second decoding stage comprises two said decoding substages including said final substage.

44. The decoder of claim 43 wherein $N_1 = N_2 N_3$.

45. The decoder of claim 44 wherein $N_1 = N_2 = N_3 = 8$.

46. The decoder of claim 1 or 3 wherein n is 4 and said second decoding stage comprises three said substages including said final substage.

47. The decoder of claim 1 or 3 wherein N=24.

48. The decoder of claim 3 or 4 wherein said code comprises a binary code.

49. The decoder of claim 48 wherein said code is a (24, 12, 8) Golay code.

50. The decoder of claim 1 or 3 wherein said second decoding stage selects said finally decoded codeword based on a Viterbi algorithm.

51. The decoder of claim 1, 2, 3, or 4 wherein
said means for evaluating said distances generates normalized versions of said distances such that the relative distance rankings of said partial codewords are not affected,
said normalized versions being generated without multiplications.

52. The decoder of claim 51 wherein
said means for evaluating said distances generates said normalized versions such that the distance between the ith symbol $r_i$ of said N-tuple r can be obtained directly from $r_i$.

53. The decoder of claim 51 wherein
said means for evaluating said distances generates said normalized versions such that the distance of each said partial codeword and its complement are the same except for their signs.

54. The decoder of claim 2 or 4 wherein each said combination is an $N_p$-tuple, where $N_p = 2^s$, s an integer, and said parts making up said $N_p$-tuple comprise $N_p/2$-tuples.

55. The decoder of claim 54, wherein said decoder iteratively evaluates 1-tuples, 2-tuples, ..., $N_p$-tuples.

56. The decoder of claim 1, 2, 3, or 4 adapted for use in a communication system of the kind in which information to be sent over a band-limited channel is encoded into a succession of said codewords, and wherein said decoder comprises means for deciding which codeword was sent on the basis of a received set of values corresponding to said N-tuple 57. The decoder of claim 1 or 2 wherein
said lattice is equivalent to a lattice of points whose coordinates are integers.

58. The decoder of claim 57 wherein
said integer lattice is equivalent to a 24-dimensional Leech-type lattice.

59. The decoder of claim 58 wherein the maximum number of said survivors in any said substage is $2^8$.

60. The decoder of claim 58 wherein said decoder comprises means for applying, as stages in decoding said N-tuple r, binary decoding procedures applicable to a Golay code, said binary decoding procedures being applied twice, once to a Leech half-lattice, and the second time to a coset of said Leech half-lattice.

61. The decoder of claim 57 wherein
said lattice is equivalent to an integer lattice based on binary codes, and
said decoder comprises decoding means for applying, as stages in decoding said N-tuple r, binary decoding procedures applicable to said binary codes.

62. The decoder of claim 61 wherein
said lattice has points such that a predetermined set of coordinate coefficients for the symbols of said points has odd or even parity,
said decoder further comprises
means for decoding said N-tuple r without regard to said parity into a near possible codeword, and
means for modifying one said selected near possible codeword by changing a single said symbol to satisfy said parity.

63. The decoder of claim 62 wherein
said single symbol is selected as the one that is most distant from the corresponding coordinate of said N-tuple r.

64. The decoder of claim 61 wherein said lattice is a Leech half-lattice, said binary codes include a Golay code, and the said binary decoding procedures include a decoding procedure for said Golay code.

65. The decoder of claim 1, 2, 3, or 4 wherein said codewords are each a linear combination of rows of a matrix that can be expressed in the form:

$$G = \begin{bmatrix} A & 0 & 0 \\ 0 & A' & 0 \\ 0 & 0 & A'' \\ B & B' & 0 \\ 0 & B'' & B''' \\ C & C' & C'' \end{bmatrix}$$

and wherein each column of said matrix G corresponds to one said section.

66. The decoder of claim 65 wherein
$A = A' = A''$
$B = B' = B'' = B'''$
$C = C' = C''$.

67. The decoder of claim 65 wherein A generates a dense lattice, B and A together generate a dense lattice with smaller distance, and C, B, and A together generate a dense lattice with still smaller distance.

68. The decoder of claim 65 wherein A generates a code of large distance, B and A together generate a code with smaller distance, and C, B, and A together generate a code of still smaller distance.

69. The decoder of claim 65 wherein
$A = A' = A''$
$B = B' = B'' = B'''$
$C = C' = C''$.

70. The decoder of claim 1, 2, 3, or 4 wherein said codewords are each a linear combination of rows of a matrix that can be expressed in the form $$G = \begin{bmatrix} A & 0 & 0 & 0 \\ 0 & A & 0 & 0 \\ 0 & 0 & A & 0 \\ 0 & 0 & 0 & A \\ B & B & 0 & 0 \\ 0 & B & B & 0 \\ 0 & 0 & B & B \\ C & C & C & C \end{bmatrix}$$

71. The decoder of claim 70 where said sections correspond to columns of said matrix.

72. The decoder of claim 1 or 2 further comprising means for transforming each N-tuple r into a form that is generated by a predetermined form of matrix.

73. The decoder of claim 72 wherein said transformation is an inverse permutation.

74. The decoder of claim 72 wherein said transformation is a rotation in two-dimensional space.

75. The decoder of claim 1 or 2 wherein said codeword is the nearest codeword to said N-tuple r.

76. The decoder of claim 1 or 3 wherein each said substage of said first decoding stage comprises
means for selecting multiple survivors from sets of partial codewords near to a given $N_j$-tuple $r_j$, each said partial codeword comprising $N_j$ symbols appearing in a subset of said codewords, said $N_j$-tuple $r_j$ comprising a sequence of $N_j < N$ real values representing signals, the values $r_i$ of said $N_j$-tuple $r_j$ being organized into $n_j$ sections $r_K$ respectively of lengths $N_K$, $1 \leq k \leq n_j$ where $n_j \geq 2$, $N_K < N_j$, said means for selecting comprising at least third and fourth decoding stages,
said third decoding stage comprising a substage for each section $r_K$, $1 \leq k \leq n_j$,
each said substage of said third decoding stage comprising
means for evaluating distances between multiple sets of possible partial codewords and said section $r_k$, said partial codewords comprising the corresponding $N_K$ of said symbols appearing in a subset of said codewords,
means for selecting as a survivor from each of said multiple sets one said partial codeword, said selection being based on said distances, and for providing information indicative of each of said multiple survivors and its distance to said second decoding stage,
said fourth decoding stage comprising n-1 substages, each substage in said fourth stage corresponding to a supersection comprising at least two said sections,
each said substage of said fourth stage corresponding to a supersection made up of a combination of two parts, each said part being a said section or a said supersection combined in an earlier said substage of said second stage, a final said substage corresponding to a final said supersection corresponding to the complete said $N_j$-tuple $r_j$,
each said substage of said fourth stage comprising
means for evaluating distances between multiple sets of possible partial codewords and said received values in the corresponding said supersection, said evaluation being based on said information indicative of said survivor distances for said survivors corresponding to each of the two said parts,
means for selecting as a survivor from each of said multiple sets one said partial codeword on the basis of said distances, and for providing information indicative of each of said multiple survivors and its distance to subsequent said decoding substages of said fourth stage, or, if said substage is the final said substage, as a final output of said means for selecting.

77. The decoder of claims 1 or 3 wherein $N_j = 2$.

78. A suboptimal decoder for selecting a codeword near to a given N-tuple r, N an integer, said N-tuple r comprising a sequence of N real values $r_i$ representing signals, said codeword representing a point in an N-dimensional lattice equivalent to a lattice of a kind that can be defined as all integer N-tuples such that the ones, two, ... coefficients N-tuples are codewords respectively in binary codes (N, $K_1$), (N, $K_2$), ..., (N, $K_n$), where $K_1, K_2, \ldots$ are integers and $n > 2$, said decoder comprising
means for applying soft-decision decoding applicable respectively to the binary codes (N, $K_i$), $1 < i < n$, and
wherein said (N, $K_n$) code is an (N, N−1) single-parity-check code, and
wherein said soft-decision decoding for said single-check code comprises
means for making preliminary decisions on each coordinate of said single-parity-check code,
means for checking parity of said preliminary decisions, and
means for changing one of said preliminary decisions if said parity fails to check.

79. The decoder of claim 78 wherein said lattice is a Leech half-lattice.

80. The decoder of claim 78 wherein one said binary code is a Golay code.

81. The decoder of claim 78, 79 or 80 wherein said means for changing one of said preliminary decisions comprises means for identifying the said coordinate where the said preliminary decision was least reliable, and means for changing said preliminary decision in said least reliable coordinate.

82. A suboptimal decoder for selecting a codeword near to a given N-tuple r, N an integer, said N-tuple r comprising a sequence of N real values $r_i$ representing signals, said codeword representing a point in an N-dimensional lattice equivalent to a lattice of a kind that can be defined as all integer N-tuples such that the ones, twos, . . . coefficients N-tuples are codewords respectively in binary codes (N, $K_1$), (N, $K_2$), . . . , (N, $K_n$), where $K_1$, $K_2$, . . . are integers and $n \geq 2$, said decoder comprising a decoder for applying soft-decision decoding applicable respectively to the binary codes (N, $K_i$), $1 \leq i \leq n$, to produce decoded codewords, $x_1, x_2, \ldots, x_n$ corresponding respectively to said binary codes (N, $K_1$), (N, $K_2$), . . . , (N,$K_n$), and means for producing the codeword near to the given N-tuple r from said decoded codewords $x_1, x_2, \ldots, x_n$, and wherein said lattice is a Leech half-lattice.

83. A suboptimal decoder for selecting a codeword near to a given N-tuple r, N an integer, said N-tuple r comprising a sequence of N real values $r_i$ representing signals, said codeword representing a point in an N-dimensional lattice equivalent to a lattice of a kind that can be defined as all integer N-tuples such that ones, twos, . . . coefficients N-tuples are codewords respectively in binary codes (N, $K_1$), (N, $K_2$), . . . , (N, $K_n$), where $K_1$, $K_2$, . . . are integers and $n \geq 2$, said decoder comprising a decoder for applying soft-decision decoding applicable respectively to the binary codes (N, $K_i$), $1 \leq i \leq n$, to produce decoded codewords, $x_1, x_2, \ldots, x_n$ corresponding respectively to said binary codes (N, $K_1$), (N, $K_2$), . . . , (N,$K_n$), and means for producing the codeword near to the given N-tuple r from said decoded codewords $x_1, x_2, \ldots, x_n$, and wherein one said binary code is a Golay code, and another said binary code is a single-parity-check code.

* * * * *

UNITED STATES PATENT AND TRADEMARK OFFICE
CERTIFICATE OF CORRECTION

PATENT NO. : 4,933,956

DATED : June 12, 1990

INVENTOR(S) : George D. Forney, Jr.

It is certified that error appears in the above-identified patent and that said Letters Patent is hereby corrected as shown below:

In the abstract, line 15, insert a space between "Eachof".

Figure 24:
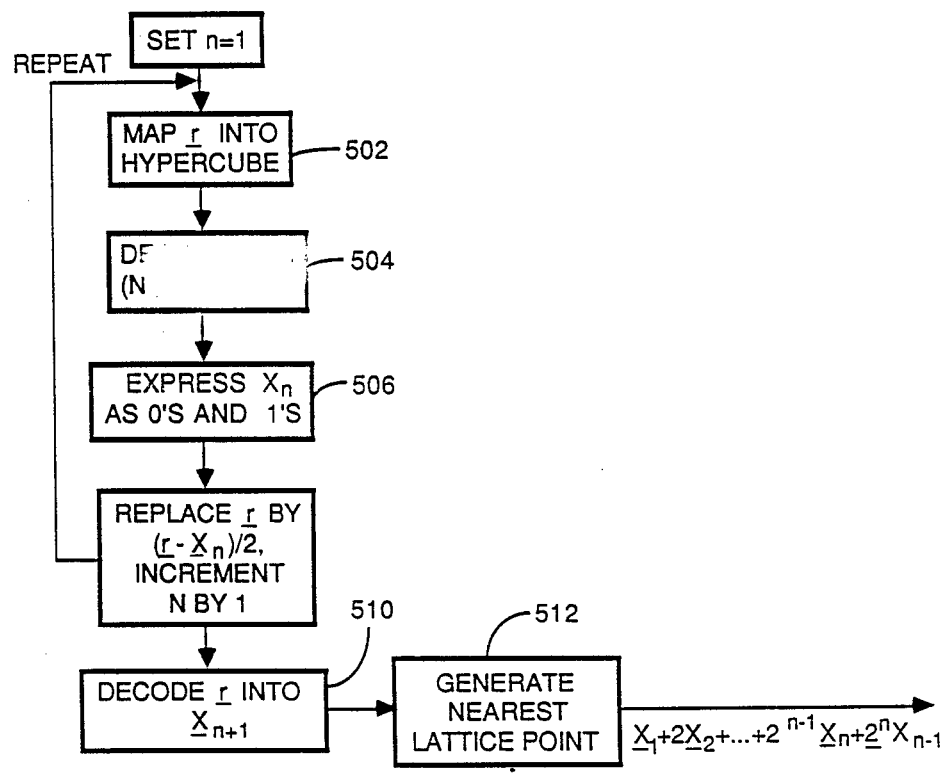
FIGS. 24, 25 are a flow chart of a technique and a block diagram of corresponding apparatus for decoding a lattice that is based on binary codes.
Figure 25:
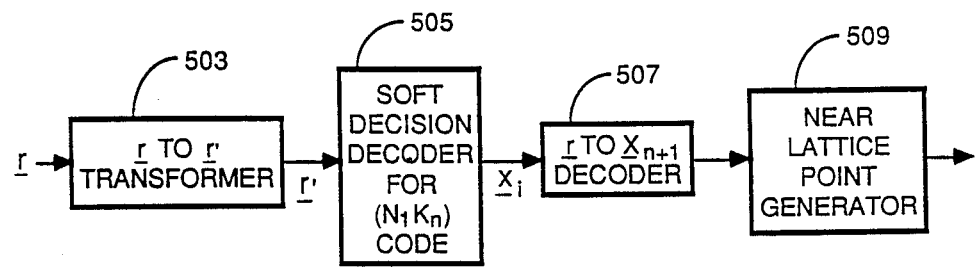

In the drawings, Fig. 24, Ref. 504, insert the following inside the black box:

--DECODE $\underline{r}'$ IN--
 $(N,K_1)$ $\overline{\text{CODE}}$

Column 2, line 13, "$R_i$" should be --$r_i$--.

Column 6, line 30, "Decodinq" should be --Decoding--.

Column 7, line 18, insert --$\underline{a}$ and-- before "b are".

Column 7, line 20, insert a line after "$G_{10}$".

Column 9, line 23, "Path" should be --path--.

Column 11, line 56, "subtractiosn" should be --subtractions--.

Column 15, line 17, insert --as $G_4$. The $2^8$-- after "well".

Column 22, line 35, insert --+-- after "K" (first occurrence).

Column 22, line 67, insert --$\leq$-- between "i24".

Column 26, line 2, "ccefficient" should be --coefficient--.

UNITED STATES PATENT AND TRADEMARK OFFICE
CERTIFICATE OF CORRECTION

PATENT NO.   : 4,933,956
DATED        : June 12, 1990
INVENTOR(S)  : George D. Forney, Jr.

It is certified that error appears in the above-identified patent and that said Letters Patent is hereby corrected as shown below:

Column 26, line 57, delete "+" (first occurrence).

Column 28, line 38, "Obtained" should be --obtained--.

Column 28, line 60, insert --there will be three sets of intermediate states in each-- before "subtrellis".

Column 35, line 20, "os" should be --of--.

Column 37, line 2, delete "code with" and insert --dense lattice of-- before "still".

Column 37, line 52, insert --=-- between "$N_2 N_3$".

Column 38, line 28, insert --$\underline{r}$.-- after "N-tuple".

Column 39, line 60, "multiPle" should be --multiple--.

Column 39, line 60, insert --multiple-- after "from".

Column 40, line 19, delete hyphen between "in-said".

Signed and Sealed this

First Day of September, 1992

Attest:

DOUGLAS B. COMER

Attesting Officer     Acting Commissioner of Patents and Trademarks